US012640174B2

(12) United States Patent
Sun et al.

(10) Patent No.: US 12,640,174 B2
(45) Date of Patent: May 26, 2026

(54) SYSTEM AND METHOD FOR IMPROVING EFFICIENCY OF MULTI-STORAGE-ROW COMPUTE-IN-MEMORY

(71) Applicant: Taiwan Semiconductor Manufacturing Company, Ltd., Hsinchu (TW)

(72) Inventors: Xiaoyu Sun, Hsinchu City (TW); Brian Crafton, Hsinchu City (TW); Murat Kerem Akarvardar, Hsinchu City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 225 days.

(21) Appl. No.: 18/642,339

(22) Filed: Apr. 22, 2024

(65) Prior Publication Data

US 2025/0210078 A1    Jun. 26, 2025

Related U.S. Application Data

(60) Provisional application No. 63/613,528, filed on Dec. 21, 2023.

(51) Int. Cl.
*G11C 7/22* (2006.01)
*G11C 7/10* (2006.01)

(52) U.S. Cl.
CPC .......... *G11C 7/1057* (2013.01); *G11C 7/1012* (2013.01); *G11C 7/1096* (2013.01)

(58) Field of Classification Search
CPC ... G11C 7/1057; G11C 7/1012; G11C 7/1096; G11C 7/22; G11C 7/1006; G11C 7/1009; G11C 11/54
USPC ...................................................... 365/189.05
See application file for complete search history.

(56) References Cited

U.S. PATENT DOCUMENTS

| | | | |
|---|---|---|---|
| 2022/0043632 A1 | 2/2022 | Song | |
| 2022/0383081 A1* | 12/2022 | Liu | G06N 3/0464 |
| 2024/0419758 A1* | 12/2024 | Ware | G06F 7/5443 |

* cited by examiner

*Primary Examiner* — Huan Hoang
(74) *Attorney, Agent, or Firm* — Foley & Lardner LLP

(57) ABSTRACT

A memory circuit includes an array, a first buffer, a second buffer, a fetch circuit, and a controller. The fetch circuit can be configured to fetch a first subset of a first data elements from the first buffer and temporarily store the first subset of the first data elements, during a first cycle to write the first subset of the first data elements to a first subset of a plurality of processing elements (PEs) arranged along a first one of rows in the array. The controller can be configured to control the fetch circuit to selectively limit fetching a second subset of the first data elements from the first buffer, during a second subsequent cycle to write a second subset of the first data elements to a second subset of the PEs arranged along a second one of the rows.

20 Claims, 12 Drawing Sheets

(b)  Active rows  522

(a)  Active rows  521

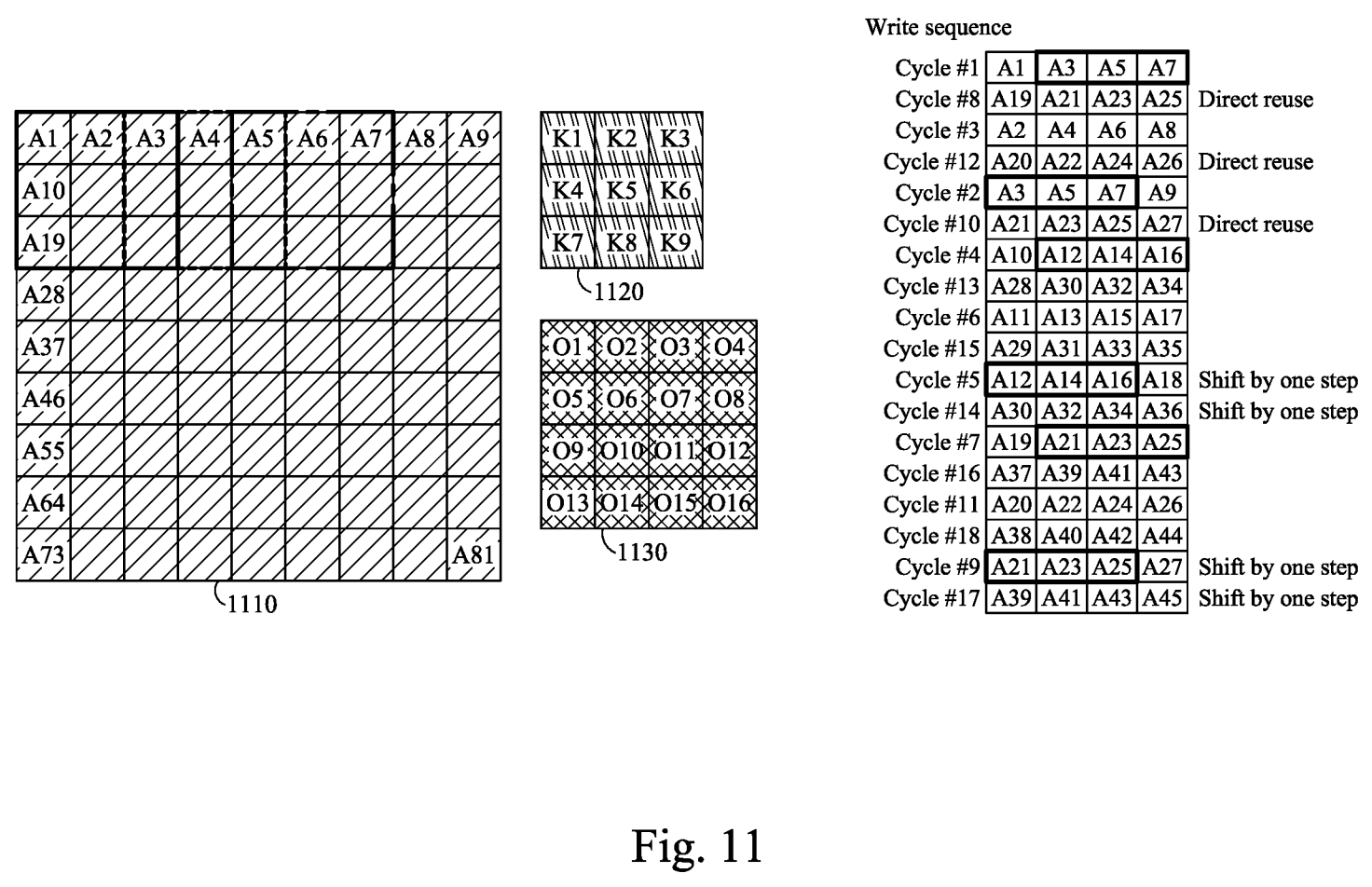

| Write sequence | | | | |
|---|---|---|---|---|
| Cycle #1 | A1 | A3 | A5 | A7 | Direct reuse |
| Cycle #8 | A19 | A21 | A23 | A25 |
| Cycle #3 | A2 | A4 | A6 | A8 | Direct reuse |
| Cycle #12 | A20 | A22 | A24 | A26 |
| Cycle #2 | A3 | A5 | A7 | A9 | Direct reuse |
| Cycle #10 | A21 | A23 | A25 | A27 |
| Cycle #4 | A10 | A12 | A14 | A16 |
| Cycle #13 | A28 | A30 | A32 | A34 |
| Cycle #6 | A11 | A13 | A15 | A17 |
| Cycle #15 | A29 | A31 | A33 | A35 |
| Cycle #5 | A12 | A14 | A16 | A18 | Shift by one step |
| Cycle #14 | A30 | A32 | A34 | A36 | Shift by one step |
| Cycle #7 | A19 | A21 | A23 | A25 |
| Cycle #16 | A37 | A39 | A41 | A43 |
| Cycle #11 | A20 | A22 | A24 | A26 |
| Cycle #18 | A38 | A40 | A42 | A44 |
| Cycle #9 | A21 | A23 | A25 | A27 | Shift by one step |
| Cycle #17 | A39 | A41 | A43 | A45 | Shift by one step |

Fig. 11

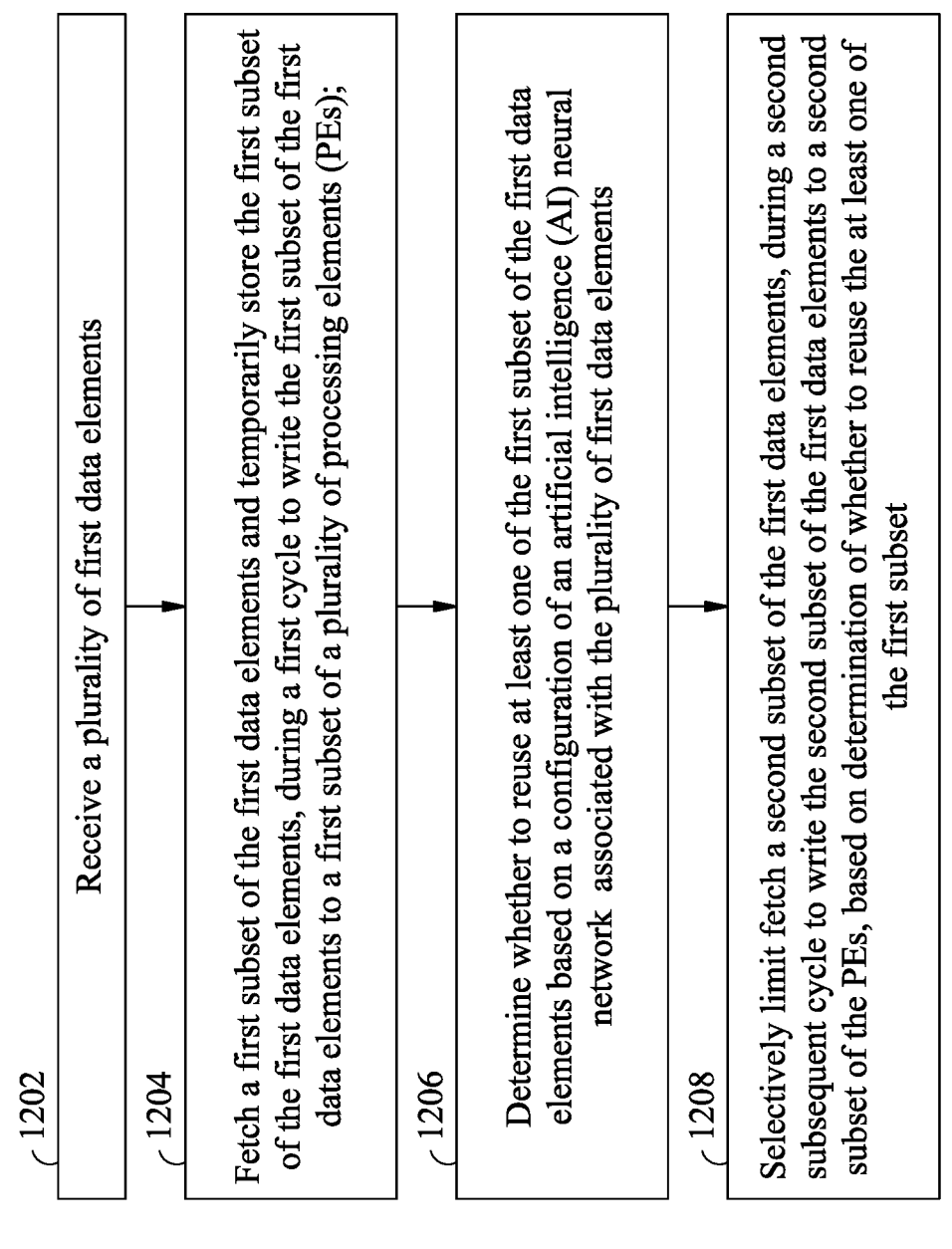

1200

1202 Receive a plurality of first data elements

1204 Fetch a first subset of the first data elements and temporarily store the first subset of the first data elements, during a first cycle to write the first subset of the first data elements to a first subset of a plurality of processing elements (PEs);

1206 Determine whether to reuse at least one of the first subset of the first data elements based on a configuration of an artificial intelligence (AI) neural network associated with the plurality of first data elements 1208 Selectively limit fetch a second subset of the first data elements, during a second subsequent cycle to write the second subset of the first data elements to a second subset of the PEs, based on determination of whether to reuse the at least one of the first subset

Fig. 12

SYSTEM AND METHOD FOR IMPROVING EFFICIENCY OF MULTI-STORAGE-ROW COMPUTE-IN-MEMORY

CROSS-REFERENCE TO RELATED APPLICATION

This application claims priority to and the benefit of U.S. Provisional Application No. 63/613,528, filed Dec. 21, 2023, entitled "SYSTEM AND METHOD FOR IMPROVING EFFICIENCY OF MULTI-STORAGE-ROW COMPUTE-IN-MEMORY," which is incorporated herein by reference in its entirety for all purposes.

BACKGROUND

Memory devices are integral components of electronic systems, storing data in a manner that allows for rapid access and modification. Traditionally, memory devices have been designed to store binary information in the form of "0"s and "1"s across a vast array of memory cells. Compute-in-memory (CIM) technology integrates processing capabilities directly within memory arrays, enabling faster data computation by reducing the distance data must travel between storage and processing elements. Multi-storage-row CIM is designed with fixed data mapping.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 11 illustrates an example data mapping in a multi-storage-row compute-in-memory (CIM) array, in accordance with some embodiments.

FIG. 12 illustrates a flowchart of an example method of operating a compute-in-memory (CIM) circuit, in accordance with some embodiments.

DETAILED DESCRIPTION

Figure 1:
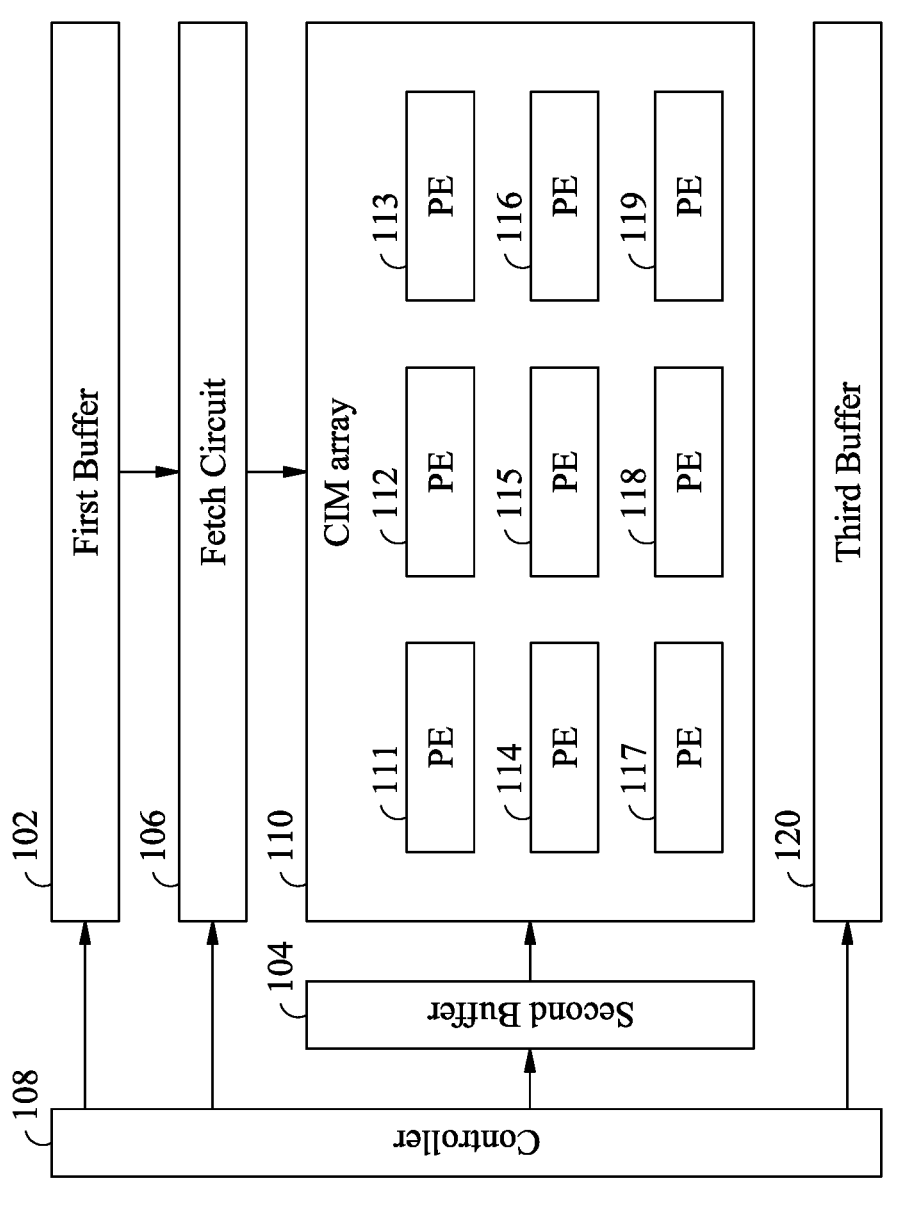
FIG. 1 is a block diagram illustrating an example of a memory circuit, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Deep learning utilizes neural networks to achieve artificial intelligence. These networks comprise numerous processing nodes that are interlinked, facilitating machine learning through the analysis of example data. Take, for instance, a system designed to recognize objects: it might process thousands of object images, such as trucks, to discern and learn the visual patterns that correspond to the object in new images. The structure of neural networks is typically in layers, and data flows through these layers in a single, forward direction. Each node within the network may have connections to multiple nodes in the subsequent layer to which it sends data, as well as to numerous nodes in the preceding layer from which it receives data.

Within the neural network, a node attributes a numerical value, termed a "weight," to its connections. When activated, a node can multiply incoming data by this weight and sum up the products from all its connections, resulting in a single numeric output. If the output falls below a certain threshold, the node can withhold it from progressing to the next layer. Conversely, if the output surpasses the threshold, the node can transmit this sum to the nodes it is connected to in the following layer. In a deep learning system, a neural network model is stored in memory and computational logic in a processor performs multiply-accumulate (MAC) computations on the parameters (e.g., weights) stored in the memory.

A conventional digital multiplier takes two operands as digital words and produces a digital result, handling signing and scaling. Compute-in-memory (CIM) uses a different approach, storing a weight coefficient as analog values in a specially designed transistor cell sub-array with rows and columns. The incoming digital data words enter the rows of a CIM array, triggering analog voltage multiples, then analog current summations occur along columns. An analog-to-digital converter creates the final digital word outputs from the summed analog values.

In a multi-storage-row Compute-in-Memory (CIM) architecture, data mapping can be a fixed process where weights are mapped to storage rows. In the process, the same data in a buffer can be accessed by multiple times. This inflexible mapping strategy can lead to significant underutilization of the storage rows, particularly when dealing with neural network layers that possess diverse characteristics and requirements, leading to inefficient memory use and suboptimal performance.

Moreover, the processing of input activations in convolutional neural networks (CNNs) often exacerbates energy consumption due to redundant data handling. During computation, input activations within a convolution window are read from a buffer, transformed into a single vector, and then dispatched to the CIM macro for processing. However, such method introduces inefficiency; the overlapped activations shared across different convolution windows are retrieved multiple times from the buffer. This repeated fetching process not only increases the computational load but also incurs extra energy expenditure for buffer access, thereby diminishing the overall energy efficiency of the memory circuit. An optimized approach that reduces redundant buffer accesses can significantly enhance the energy profile of CIM operations.

The present disclosure provides various embodiments of a memory circuit that address such issues (e.g., repeated fetching). For example, the memory circuit as disclosed herein, includes an array, a first buffer, a second buffer, a fetch circuit, and a controller. The fetch circuit can be configured to fetch a first subset of a first data elements from the first buffer and temporarily store the first subset of the first data elements, during a first cycle to write the first subset of the first data elements to a first subset of a plurality of processing elements (PEs) arranged along a first one of rows in the array. The controller can be configured to control the fetch circuit to selectively limit fetching a second subset of the first data elements from the first buffer, during a second subsequent cycle to write a second subset of the first data elements to a second subset of the PEs arranged along a second one of the rows.

The present disclosure outlines an approach to enhancing the energy efficiency and processing throughput of convolutional neural networks (CNNs), pivotal in artificial intelligent (AI)-driven tasks such as computer vision applications. By dynamically adapting the data mapping and operational flow within the multi-storage-row Compute-in-Memory (CIM) macro to suit the unique demands of various neural network layers, the present disclosure provides significant improvements in computational performance. Additionally, the present disclosure introduces an optimized method to curtail activation buffer accesses. This is achieved by exploiting the intrinsic data reuse in stride-based convolution operations, a common feature in CNNs, thereby minimizing the energy costs typically associated with repeated data retrieval. The advancements presented in this disclosure are poised to set a new benchmark for energy and operational efficiency in the field of AI, particularly in applications involving convolutional layers.

The present disclosure introduces an adaptive data mapping protocol that intelligently reconfigures the allocation of data and operational sequences to align with the distinct characteristics of various neural network layers, thereby optimizing the utilization of Compute-in-Memory (CIM) resources. This flexibility is made possible through the implementation of customized peripheral circuits, meticulously designed to support this dynamic data mapping. These circuits are engineered to facilitate shift-based data fetching, a method that aligns with the inherent data reuse patterns of stride-based convolution operations, characteristic of many deep learning workloads.

In addition, the present disclosure includes a specific write sequence protocol that tailors the memory interactions to the particular hardware configuration and the unique demands of the workload in question. This protocol is particularly beneficial when employed in conjunction with an input-stationary dataflow paradigm within a multi-storage-row CIM setup. By doing so, it considerably enhances the reuse of activation data-critical for amplifying the efficiency and throughput of the system. Such a tailored approach not only reduces the operational overhead but also streamlines the computational process, ensuring that energy consumption is kept to a minimum while maximizing performance.

The present disclosure presents an advanced adaptive data mapping technique aimed at significantly improving the utilization of storage rows, thereby enhancing both throughput and energy efficiency across different layers of a neural network. By intelligently adjusting the allocation of data to storage rows based on the unique requirements of each layer, this method ensures a more efficient use of memory resources. Complementing this, the present disclosure introduces a shift-based write operation that is optimized to reduce the number of times activation data must be accessed from the buffer. This approach not only lessens the computational load on the memory circuit but also leads to a marked improvement in energy efficiency. Such operations are crucial for high-performance computing tasks where the balance between speed and power consumption is paramount.

FIG. 1 is a block diagram illustrating an example of a memory circuit 100, in accordance with some embodiments. The memory circuit 100 may include an array 110, a first buffer 102, a second buffer 104, a fetch circuit 106, a controller 108, and a third buffer 120. Although certain components are shown in FIG. 1, embodiments are not limited thereto, and more or fewer components may be included in the memory circuit 100. In some embodiments, the memory circuit 100 can be used as a building block for an artificial intelligence (AI) accelerator.

In some embodiments, the first buffer 102 (e.g., input buffer) may include one or more memories (e.g., registers) that can receive and store inputs (e.g., input activation data) for an artificial intelligence (AI) neural network. For example, these inputs can be received as outputs from, e.g., a different memory circuit 100 (not shown), a global buffer (not shown), or a different device. The inputs from the input buffer 102 may be provided to the fetch circuit 106 and/or the PE array 110 for processing as described below. In some embodiments, the first buffer 102 can be configured to store first data elements (e.g., input activations or weights) and output the first data elements to the array 110. In some embodiments, the first buffer 102 can be coupled to a memory array (not shown). The memory array may comprise a plurality of memory cells. The plurality of memory cells can store inputs or weights for a neural network. One or more peripheral circuits (not shown) may be located at one or more regions peripheral to, or within, the memory array. The memory cells and the periphery circuits may be coupled by word lines and/or complementary bit lines BL and BLB, and data can read from and written to the memory bit cells via the complementary bit lines BL and BLB.

Different voltage combinations applied to the word lines and bit lines may define a read, erase, or write (program) operation on the memory bit cells. In some embodiments, the memory array architecture can incorporate various types of non-volatile or volatile memory technologies, including but not limited to static random-access memory (SRAM), resistive random-access memory (ReRAM), magnetoresistive random-access memory (MRAM), and phase-change random access memory (PCRAM).

In some embodiments, the second buffer 104 (e.g., weight buffer) may include one or more memories (e.g., registers) that can receive and store weights for an artificial intelligence (AI) neural network. The weight buffer 104 may receive and store weights from, e.g., a different memory circuit 100 (not shown), a global buffer (not shown), or a different device. The weights from the weight buffer 104 may be provided to the fetch circuit 106 and/or the PE array 110 for processing as described below. In some embodiments, the second buffer 104 can be configured to store second data elements (e.g., input activations or weights) and output the second data elements to the array 110. In some embodiments, the second buffer 104 can be coupled to a memory array (not shown). The memory array may comprise a plurality of memory cells. The plurality of memory cells can store inputs or weights for a neural network.

In some embodiments, the array 110 may comprise a plurality of processing elements (PEs) arranged over a plurality of columns and a plurality of rows (e.g., 111, 112, 113, 114, 115, 116, 117, 118, and 119). Each of the PEs 111, 112, 113, 114, 115, 116, 117, 118, 119 may include at least one of: a register (or memory), a multiplexor (mux), a multiplier, or an adder. The register can be a storage space for units of memory that are used to transfer data for immediate use by the CPU (Central Processing Unit) for data processing. The multiplexer (mux) can be a network device that allows one or more analog or digital input signals to travel together over the same communications transmission link. The multiplier may perform a multiplication operation of the output of the register and/or the MUX. The adder may add the output of the multiplier and the output of the mux. The PE may receive data signals including input, weight, and previous output. Each of the PEs 111, 112, 113, 114, 115, 116, 117, 118, 119 can be configured to perform a multiplication and accumulation (MAC) operation on a corresponding one of a plurality of first data elements (e.g., input activations) and a corresponding one of a plurality of second data elements (e.g., weights). In some embodiments, the array 110 can be a Compute-in-Memory (CIM) array. The first row may include PEs 111-113, the second row may include PEs 114-116, and the third row may include PEs 117-119. The first column may include PEs 111, 114, 117, the second column may include PEs 112, 115, 118, and the third column may include PEs 113, 116, 119. Although the memory circuit 100 includes 9 PEs 111-119, embodiments are not limited thereto and the memory circuit 100 may include more or fewer PEs. The PEs 111-119 may perform multiplication and accumulation (e.g., summation) operations (MAC operations) based on inputs and weights that are received and/or stored in the first buffer 102 (e.g., input buffer), the second buffer 104 (e.g., weight buffer), the fetch circuit 106 or received from a different PE (e.g., PE 111-119). The output of a PE (e.g., PE 111) may be provided to one or more different PEs (e.g., PE 112, 114) in the same CIM array 110 for multiplication and/or summation operations.

For example, the PE 111 may receive a first input (e.g., first data elements) from the first buffer 102 (through the fetch circuit 106) and a first weight (e.g., second data elements) from the second buffer 104 and may perform multiplication and/or summation operations based on the first input and the first weight. The PE 114 may receive the output of the PE 111, a second input from the first buffer 102 (through the fetch circuit 106), and a second weight from weight buffer 104, and may perform multiplication and/or summation operations based on the output of the PE 111, the second input, and the second weight. The PE 117 may receive the output of the PE 114, a third input from the first buffer 102 (through the fetch circuit 106), and a third weight from weight buffer 104 and perform multiplication and/or summation operations based on the output of the PE 114, the third input, and the third weight. The PE 112 may receive the output of the PE 111, a fourth input from the first buffer 102 (through the fetch circuit 106), a fourth weight from weight buffer 104 and perform multiplication and/or summation operations based on the output of the PE 111, the fourth input, and the fourth weight. The PE 115 may receive the outputs of PEs 112 and 114, a fifth input from the first buffer 102 (through the fetch circuit 106), and a fifth weight from the weight buffer 104 and perform multiplication and/or summation operations based on the outputs of the PEs 112 and 114, the fifth input, and the fifth weight. The PE 118 may receive the outputs of PEs 115 and 117, a sixth input from the first buffer 102 (through the fetch circuit 106), and a sixth weight from the weight buffer 104, and may perform multiplication and/or summation operations based on the outputs of the PEs 115 and 117, the sixth input, and the sixth weight. The PE 113 may receive the output of the PE 112, a seventh input from the first buffer 102 (through the fetch circuit 106), a seventh weight from weight buffer 104 and perform multiplication and/or summation operations based on the output of the PE 112, the seventh input, and the seventh weight. The PE 116 may receive the outputs of PEs 113 and 115, an eighth input from the first buffer 102 (through the fetch circuit 106), and an eighth weight from the weight buffer 104, and may perform multiplication and/or summation operations based on the outputs of the PEs 113 and 115, the eighth input, and the eighth weight. The PE 119 may receive the outputs of PEs 116 and 118, a ninth input from the first buffer 102 (through the fetch circuit 106), and a ninth weight from the weight buffer 104, and may perform multiplication and/or summation operations based on the outputs of the PEs 116 and 118, the ninth input, and the ninth weight. For a bottom row of PEs of the PE array (e.g., PEs 117-119), the outputs may also be provided to one or more accumulators (not shown) or a third buffer 120. Depending on embodiments, the first to ninth inputs and/or the first to ninth weights and/or the outputs of the PEs 111-119 may be forwarded to some or all of the PEs 111-119. These operations may be performed in parallel such that the outputs from the PEs 111-119 are provided every cycle. In some embodiments, the CIM array 110 can be a multi-storage-row compute-in-memory (CIM).

In some embodiments, the CIM array 110 may include one or more accumulators. The accumulators may sum the partial sum values of the results of the PEs 111-119. For example, a accumulator may sum the three outputs provided by the PE 117 for a set of inputs provided by the input buffer 102. Each of the accumulators may include one or more registers that store the outputs from the PEs 117-119 and a counter that keeps track of how many times the accumulation operation has been performed, before outputting the total sum to the output buffer 120. For example, an accumulator may perform summation operation of the output of PE 117 three times (e.g., to account for the outputs from the three PEs 111, 114, 117) before the accumulator provides the sum to the output buffer 120. Once the accumulators in the CIM array finish summing all of the partial values, outputs may be provided to the output buffer 120. In some embodiments, the CIM array 110 may include a digital adder circuit (or adder tree). The adder tree can sum the MAC elements to provide a final MAC result through one output channel.

In some embodiments, the fetch circuit 106 may include a plurality of multiplexers and a plurality of registers. Each of the plurality of multiplexers, controlled by the controller, may include a first input, a second input, and an output coupled to a corresponding one of the registers which is further coupled to a corresponding one of the columns. In some embodiments, the multiplexers and the corresponding registers can be connected to one another in a shift-based manner. The detailed description of the fetch circuit 106 can be found in FIGS. 5-6. In some embodiments, the fetch circuit 106 can be coupled between the first buffer 102 and the array 110. The fetch circuit 106 can be configured to fetch and store a first subset of the first data elements from the first buffer 102. For example, during a first cycle to write a first subset of the first data elements to a first subset of the PEs arranged along a first one of the rows, the fetch circuit 106 may fetch a first subset of the first data elements from the first buffer 102 and temporarily store the first subset of the first data elements. In some embodiments, the fetch circuit 106 can be a shift-based fetch module. Considering the regular pattern of overlapping activations of the CNN, the shift-based fetch module utilizes shift registers to reuse the overlapping data, thereby avoiding repeated accesses to the activation buffer.

In some embodiments, the third buffer 120 (e.g., output buffer) may include one or more memories (e.g., registers) that can receive and store outputs (e.g., partial sums) for an artificial intelligence (AI) neural network. The third buffer 120 may store the outputs of the CIM array 110 and provide these outputs to a different memory circuit (e.g., processing core) as inputs or to a global output buffer (not shown) for further processing and/or analysis and/or predictions. In some embodiments, the third buffer 120 can be a customized accumulation circuit to reduce accumulator buffer accesses in a specific mode.

In some embodiments, the controller 108 may include a hardware component that can control the coupled components (e.g., first buffer 102, second buffer 104, third buffer 120, fetch circuit 106, and CIM array 110). The controller 108 can be coupled to the fetch circuit 106 and configured to control the fetch circuit 106 to selectively limit fetching the first data elements from the first buffer 102. For example, during a second subsequent cycle to write a second subset of the first data elements to a second subset of the PEs arranged along a second one of the rows, the controller 108 may fetch part of the second subset of the first data elements from the first buffer 102. In some embodiments, the controller 108 can be configured to control signals that cater to diverse data mapping schemes within a memory architecture (e.g., memory circuit 100). These schemes can be pivotal for optimizing the spatial allocation of data. One strategy is to distribute the weights of the same single filter across multiple storage rows, allowing for parallel processing and enhanced data access speeds. This mapping strategy can lead to inefficiencies, particularly for layers that have a relatively small number of weights per filter. Another approach is to map the weights of different filters onto multiple storage rows, which can aid in the simultaneous computation of various filter outputs. Additionally, input activations are also mapped to multiple storage rows, a method that ensures quick retrieval and processing of data needed for neural network computations. By implementing these flexible mapping strategies, the system aims to enhance storage-row utilization, improve throughput, and increase energy efficiency. In some embodiments, prior to fetching any new data from the first buffer 102, the controller 108 (e.g., write scheduler) can determine whether to reuse old data in the fetch circuit 106 (e.g., shift-register) based on identifying that the old data will be overlapped by a filter in one or more following cycles in a CNN. Such reused data can be configured to generate a new output (or PS) in the next row.

In the landscape of artificial intelligence workloads, neural network layers often exhibit a wide variance in their structural dimensions, particularly in the number of output channels and the quantity of weights per filter. This diversity is evident when examining models like ResNet-50 and MobileNet-v2, as shown in Table 1, which have layers that range significantly in these dimensions. A one-size-fits-all approach to data mapping in a multi-row Compute-in-Memory (CIM) macro does not cater to this variety, leading to suboptimal utilization of memory resources. For example, considering a 64×32 CIM array with 16 rows per MAC operation, mapping exclusively the weights of the same filter to these storage rows can result in a mapped dimension of 1024×32. Under such a scheme, the storage rows can be underutilized, especially in the case of MobileNet-v2 where the maximum weights per filter do not even reach the 1024 storage rows available in each column.

TABLE 1

| Workload | Output Channel Min. | Output Channel Max. | Weights/ Filter Min. | Weights/ Filter Max. |
|---|---|---|---|---|
| ResNet-50 | 64 | 2048 | 64 | 4608 |
| MobileNet-v2 | 16 | 1280 | 9 | 960 |

Figure 3:
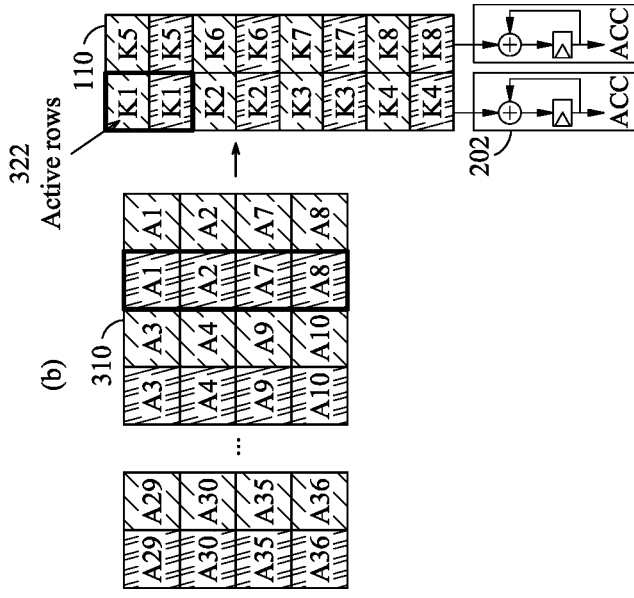
FIG. 3 illustrates an example mapping scheme in a multi-storage-row compute-in-memory (CIM) circuit, in accordance with some embodiments.
Figure 3:
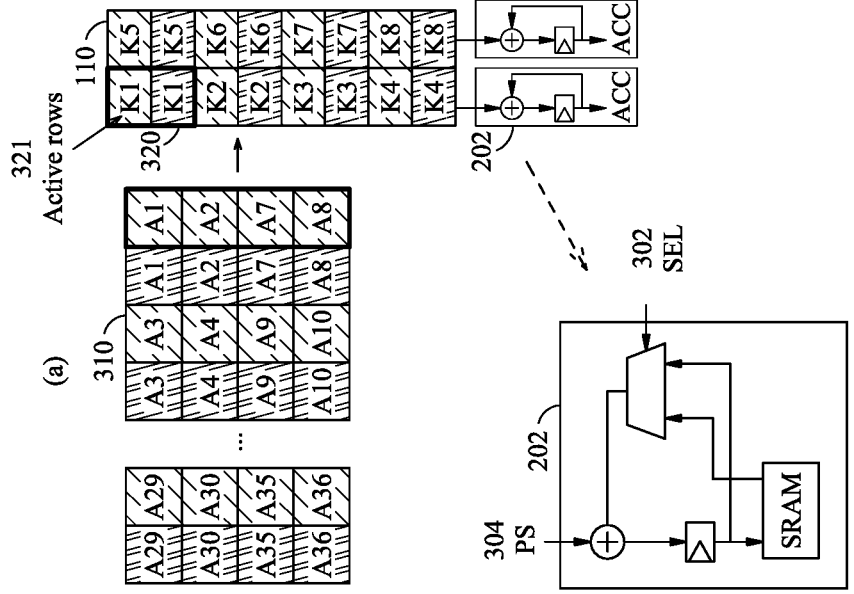
Figure 4:
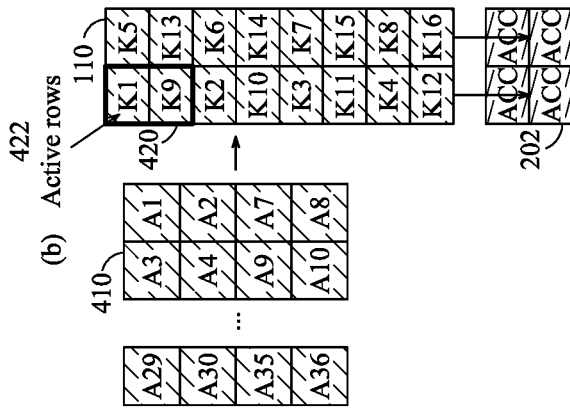
FIG. 4 illustrates an example mapping scheme in a multi-storage-row compute-in-memory (CIM) circuit, in accordance with some embodiments.
Figure 4:
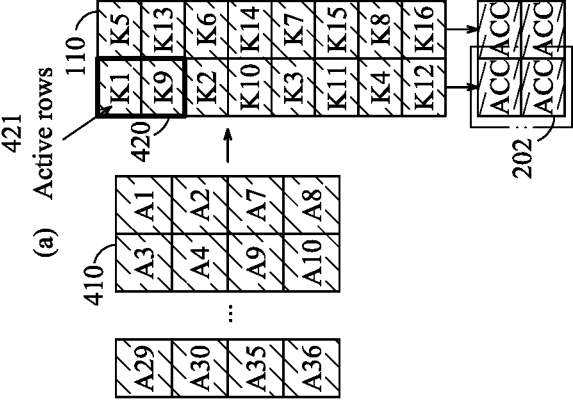
Figure 5:
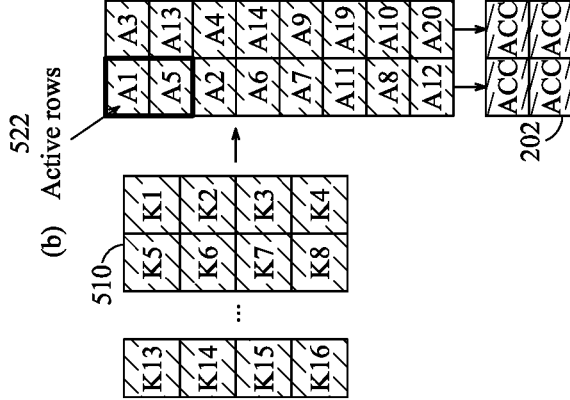
FIG. 5 illustrates an example mapping scheme in a multi-storage-row compute-in-memory (CIM) circuit, in accordance with some embodiments.
Figure 5:
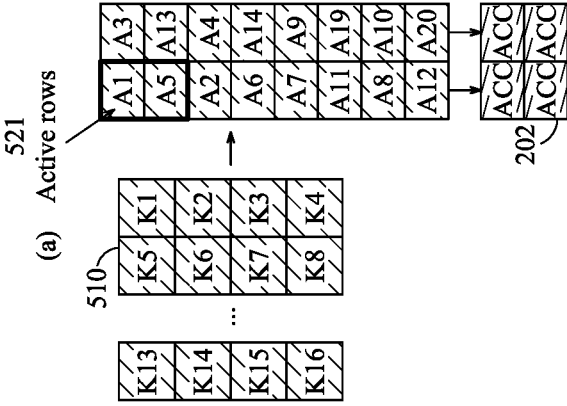

The present disclosure proposes a solution that enables a multi-row CIM macro to dynamically adapt to the requirements of different layers by introducing three distinct mapping schemes (FIGS. 3-5). These schemes allow for the flexible use of storage rows, which can be configured to map weights from the same or different filters, as well as input activations corresponding to different convolution windows. By doing so, the present disclosure ensures more efficient use of the storage rows, thereby enhancing the overall utilization and performance of the CIM macro across a spectrum of neural network architectures.

Figure 2:
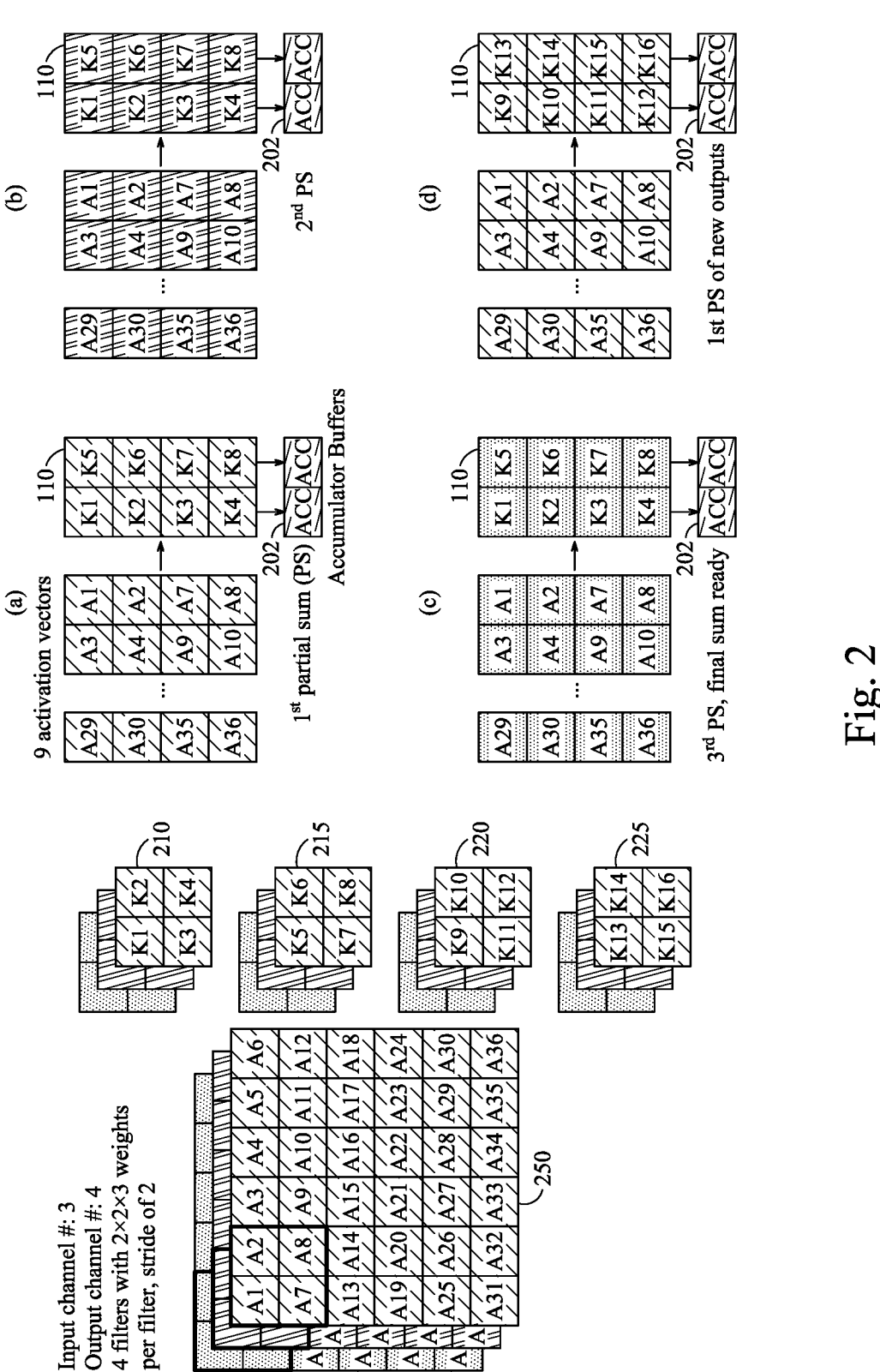
FIG. 2 illustrates an example mapping scheme in a single-storage-row compute-in-memory (CIM) circuit, in accordance with some embodiments.

FIG. 2 illustrates an example mapping scheme in a single-storage-row compute-in-memory (CIM) circuit, in accordance with some embodiments. In some embodiments, the CIM array 110 can be a single-storage-row compute-in-memory (CIM) circuit. In the example mapping scheme in FIG. 2, there are 3 input channels and 4 output channels, with a total of 4 filters (e.g., 210, 215, 220, 225) employed. Each filter is defined by a 2×2×3 weight structure, indicating that each filter kernel operates on a 2×2 region across the 3 input channels. The stride of 2 specifies the step size the filters take as they convolve across the input space. Such a setup is typical in convolutional neural networks, where multiple filters are used to extract different features from the input data, each producing its own unique output channel. The described architecture leverages multiple filters to transform the 3-dimensional input data into a 4-channel output feature map.

In some embodiments, the CIM array 110 can be a 4×2 CIM array. In FIG. 2, the dataflow operates under a weight-stationary dataflow paradigm. This configuration allows for the generation of 9 activation vectors from each input channel, following the application of a kernel to a 2×2 region across these channels. Within this framework, the accumulator buffer 202 is tasked with computing the initial partial sum (PS).

During the initial phase (e.g., Step (a)), K1 through K4 of first channel of the first filter 210 are designated to the first column of the CIM array 110, while K5 through K8 of first channel of the second filter 215 are allocated to the second column of the CIM array 110. The CIM array 110 may perform multiplication and accumulation (e.g., summation) operations based on inputs (e.g., 9 activation vectors of first channel) and weights (e.g., K1-K8 of first channel) that are mapped. Following these operations, the accumulator buffer 202 can be responsible for calculating and temporarily holding the first partial sum (PS), which is then stored within the CIM array 110 for further processing. In Step (b), K1 through K4 of second channel of the first filter 210 are designated to the first column of the CIM array 110, while K5 through K8 of second channel of the second filter 215 are allocated to the second column of the CIM array 110. The CIM array 110 may perform multiplication and accumulation (e.g., summation) operations based on inputs (e.g., 9 activation vectors) and weights (e.g., K1-K8) that are mapped. Following these operations, the accumulator buffer 202 can be responsible for calculating and temporarily holding the second partial sum (PS), which is then stored within the CIM array 110 for further processing.

In Step (c), K1 through K4 of third channel of the first filter 210 are designated to the first column of the CIM array 110, while K5 through K8 of third channel of the second filter 215 are allocated to the second column of the CIM array 110. The CIM array 110 may perform multiplication and accumulation (e.g., summation) operations based on inputs (e.g., 9 activation vectors of third channel) and weights (e.g., K1-K8 of third channel) that are mapped. Following these operations, the accumulator buffer 202 can be responsible for calculating and temporarily holding the third partial sum (PS), which is then stored within the CIM array 110 for further processing. The accumulator buffer may frequently update the partial sums, as exemplified by the three rounds of accesses demonstrated in this scenario. In Step (d), K9 through K12 of first channel of the third filter 220 are designated to the first column of the CIM array 110, while K13 through K16 of first channel of the fourth filter 225 are allocated to the second column of the CIM array 110. The CIM array 110 may perform multiplication and accumulation (e.g., summation) operations based on inputs (e.g., 9 activation vectors of first channel) and weights (e.g., K1-K4 of first channel of first filter 210) that are mapped. Following these operations, the accumulator buffer 202 can be responsible for calculating and temporarily holding the first partial sum (PS) of new outputs, which is then stored within the CIM array 110 for further processing. In some embodiments, activations may need to be reloaded many times from buffer when the CIM array 110 is updated with weights of different filters.

In some embodiments, in the weight stationary dataflow, the weights are pre-filled and stored in each PE 110 prior to the start of computation such that all of the PEs of a given filter are allocated along a column of PEs. The input feature maps (e.g., IFMAPs) can be then streamed in through the left edge of the CIM array 110 while weights being stationary in each PE, and each PE generates one partial sum every cycle. The generated partial sums can be then reduced across the rows, along each column in parallel to generate one output feature map (e.g., OFMAP) pixel per column. Input stationary dataflows are similar to weight stationary dataflows except that the order of mapping. Instead of pre-filling the CIM array 110 with weights, the unrolled IFMAPs are stored in each PE. The weights are then streamed in from the edge and each PE generates one partial sum every cycle. The generated partial sums are also reduced across the rows, along each column in parallel to generate one output feature map pixel per column. Output stationary dataflows refers to the mapping of each PE performing all the computations for one OFMAP while weights and IFMAPs are fed from the edges of the array, which are distributed to PEs using PE-to-PE interconnects. The partial sums are generated and reduced within each PE. Once all the PEs in the array complete the generation of OFMAPS, the results are transferred data out of the array through PE-to-PE interconnects.

FIG. 3 illustrates an example mapping scheme in a multi-storage-row compute-in-memory (CIM) circuit, in accordance with some embodiments. FIG. 3 illustrates an example mapping scheme of multi storage rows for weights of the same filter. In some embodiments, the CIM array 110 can be a multi-storage-row compute-in-memory (CIM) circuit. In some embodiments, the CIM array 110 can be a 4×2 CIM array with a multi-storage-row (e.g., two row per MAC cell). In the example mapping scheme in FIG. 3, there are 3 input channels and 4 output channels, with a total of 4 filters employed. This configuration allows for the generation of multiple interleaved activation vectors from input channels, following the application of a kernel to a 2×2 region across these channels. Within this framework, the accumulator buffer 202 is tasked with computing the initial partial sum (PS). In some embodiments, the accumulator buffer 202 may include an adder, a register, a multiplexer (MUX), and a memory cell (e.g., SRAM).

In this scenario, the interleaved input activation vectors 310 may correspond to the weights stored in the two storage rows 320 of the CIM array 110. The two storage rows 320 of the CIM array 110 may store weights that belong to the same filter (e.g., first filter 210, second filter 215, third filter 220, or fourth filter 225). Each column of the CIM array 110 include two storage rows. In Step (a), K1 through K4 of first channel of the first filter 210 are designated to the first column of the first row of the CIM array 110. K1 through K4 of second channel of the first filter 210 are designated to the first column of the second row of the CIM array 110. K5 through K8 of first channel of the second filter 215 are allocated to the second column of the first row of the CIM array 110. K5 through K8 of second channel of the second filter 215 are allocated to the second column of the second row of the CIM array 110. The CIM array 110 may perform multiplication and accumulation (e.g., summation) operations based on inputs (e.g., A1, A2, A7, A8 of first channel) and weights (e.g., K1, K2, K3, and K4 of first channel) that are mapped. In the step (a), the active row 321 is the first storage-row in the compute-in-memory (CIM) circuit. Following these operations, the accumulator buffer 202 can be responsible for calculating and temporarily holding the first partial sum (PS) (e.g., A1×K1+A2×K2+A7×K3+A8×K4), which is then stored within the register for further processing.

In Step (b), the CIM array 110 may perform multiplication and accumulation (e.g., summation) operations based on inputs (e.g., A1, A2, A7, A8 of second channel) and weights (e.g., K1, K2, K3, and K4 of second channel) that are mapped. In the step (b), the active row 322 is the second storage-row in the compute-in-memory (CIM) circuit. Following these operations, the accumulator buffer 202 can be responsible for calculating and temporarily holding the second partial sum (PS) (e.g., A1×K1+A2×K2+A7×K3+A8×K4), which is then stored within the CIM array 110 for further processing. This mapping scheme effectively extends the row dimension of the CIM array 110 to improve partial sum reuse. Increasing the number of rows CIM array 110 (e.g., per MAC cell) can further decrease the need for accumulator buffer accesses, although it comes with the trade-off of increased control overhead and larger array area.

Conventionally, accumulation occurs by combining the new partial sum (PS) with the previous PS retrieved from the SRAM buffer. However, the present disclosure introduces a different approach. A SEL signal 302 is employed to dynamically select the data source for accumulation. This selection can be made between the PS 304 read from SRAM and the PS stored in the register from the previous cycle. By providing flexibility in data source selection, the present disclosure enhances the efficiency and adaptability of the accumulation process, catering to varying computational requirements and optimizing resource utilization.

FIG. 4 illustrates an example mapping scheme in a multi-storage-row compute-in-memory (CIM) circuit, in accordance with some embodiments. FIG. 4 illustrates an example mapping scheme of multi storage rows for different filters. In some embodiments, the CIM array 110 can be a multi-storage-row compute-in-memory (CIM) circuit. In some embodiments, the CIM array 110 can be a 4×2 CIM array with a multi-storage-row (e.g., two row per MAC cell). In the example mapping scheme in FIG. 4, there are 3 input channels and 4 output channels, with a total of 4 filters employed. In this configuration, each input activation vector 410 can remain active for two consecutive cycles to be multiplied with two groups of filters stored in two storage rows. Within this framework, the accumulator buffer 202 is tasked with computing the initial partial sum (PS). In some embodiments, the accumulator buffer 202 may include an adder, a register, a multiplexer (MUX), and a memory cell (e.g., SRAM).

In this scenario, the input activation vectors 410 may correspond to the weights stored in the two storage rows 420 of the CIM array 110. The two storage rows 420 of the CIM array 110 may store weights that belong to the different filters (e.g., first filter 210, second filter 215, third filter 220, or fourth filter 225). In Step (a), K1 through K4 of first channel of the first filter 210 are designated to the first column of the first row of the CIM array 110. K9 through K12 of second channel of the third filter 220 are designated to the first column of the second row of the CIM array 110. K5 through K8 of first channel of the second filter 215 are allocated to the second column of the first row of the CIM array 110. K5 through K8 of second channel of the second filter 215 are allocated to the second column of the second row of the CIM array 110. The CIM array 110 may perform multiplication and accumulation (e.g., summation) operations based on inputs (e.g., A1, A2, A7, A8) and weights (e.g., K1, K2, K3, and K4) that are mapped. In the step (a), the active row 421 is the first storage-row in the compute-in-memory (CIM) circuit. Following these operations, the accumulator buffer 202 can be responsible for calculating and temporarily holding the first partial sum (PS) (e.g., A1×K1+A2×K2+A7×K3+A8×K4), which is then stored within the register for further processing.

In Step (b), the CIM array 110 may perform multiplication and accumulation (e.g., summation) operations based on inputs (e.g., A1, A2, A7, A8) and weights (e.g., K9, K10, K11, and K12) that are mapped. In this configuration, each input activation vector can remain active for two consecutive cycles to be multiplied with two groups of filters stored in two storage rows. In Step (b), the active row 422 is the second storage-row in the compute-in-memory (CIM) circuit. Following these operations, the accumulator buffer 202 can be responsible for calculating and temporarily holding the second partial sum (PS) (e.g., A1×K9+A2×K10+A7×K11+A8×K12), which is then stored within the CIM array 110 for further processing. This mapping scheme effectively extends the column dimension of the CIM array 110 to enhance activation reuse. Implementing more rows in the CIM array 110, such as per MAC cell, can further reduce activation buffer accesses, albeit at the expense of requiring a larger accumulator buffer capacity, in addition to incurring control and array area overhead. In some embodiments, the activation of two groups of accumulators 202 can be alternate. By reusing activation vectors, the number of accesses to the activation buffer can be halved.

FIG. 5 illustrates an example mapping scheme in a multi-storage-row compute-in-memory (CIM) circuit, in accordance with some embodiments. FIG. 5 illustrates an example mapping scheme of multi storage rows for input activations. In some embodiments, the CIM array 110 can be a multi-storage-row compute-in-memory (CIM) circuit. In some embodiments, the CIM array 110 can be a 4×2 CIM array with a multi-storage-row (e.g., two row per MAC cell). In the example mapping scheme in FIG. 5, there are 3 input channels and 4 output channels, with a total of 4 filters employed. In this configuration, each unrolled weight vector can remain active for two consecutive cycles to be multiplied with two groups of activations stored in two storage rows in the CIM array 110. Within this framework, the accumulator buffer 202 is tasked with computing the initial partial sum (PS). In some embodiments, the accumulator buffer 202 may include an adder, a register, a multiplexer (MUX), and a memory cell (e.g., SRAM).

In this scenario, the weights 510 may correspond to the input activation vectors stored in the two storage rows 521, 522 of the CIM array 110. The two storage rows 521, 522 of the CIM array 110 may store input activations associated with two convolution windows (e.g., input stationary). In Step (a), A1, A2, A7, A8 of the input activations 250 are designated to the first column of the first row of the CIM array 110. A5, A6, A11, A12 of the input activations 250 are designated to the first column of the second row of the CIM array 110. A3, A4, A9, A10 of the input activations 250 are designated to the second column of the first row of the CIM array 110. A13, A14, A19, A20 of the input activations 250 are designated to the second column of the second row of the CIM array 110. The CIM array 110 may perform multiplication and accumulation (e.g., summation) operations based on weight (e.g., K1, K2, K3, K4) and inputs (e.g., A1, A2, A7, and A8) that are mapped. In the step (a), the active row 521 is the first storage-row in the compute-in-memory (CIM) circuit. Following these operations, the accumulator buffer 202 can be responsible for calculating and temporarily holding the first partial sum (PS) (e.g., K1×A1+K2×A2+K3×A7+K4×A8), which is then stored within the register or the accumulator 202 for further processing.

In Step (b), the CIM array 110 may perform multiplication and accumulation (e.g., summation) operations based on inputs (e.g., K1, K2, K3, K4) and weights (e.g., A5, A6, A11, and A12) that are mapped. In this configuration, each unrolled weight vector can remain active for two consecutive cycles to be multiplied with two groups of activations stored in two storage rows in the CIM array 110. In Step (b), the active row 522 is the second storage-row in the compute-in-memory (CIM) circuit. Following these operations, the accumulator buffer 202 can be responsible for calculating and temporarily holding the second partial sum (PS) (e.g., A1×K9+A2×K10+A7×K11+A8×K12), which is then stored within the CIM array 110 for further processing. This mapping scheme effectively extends the column dimension of the CIM array 110 to enhance activation reuse. Implementing more rows in the CIM array 110, such as per MAC cell, can further reduce activation buffer accesses, albeit at the expense of requiring a larger accumulator buffer capacity, in addition to incurring control and array area overhead. In some embodiments, the activation of two groups of accumulators 202 can be alternate. By combining this mapping with shift-based fetch module can further leverage the reuse of activation data by imposing a specific write sequence (e.g., FIGS. 8-10).

Figure 6:
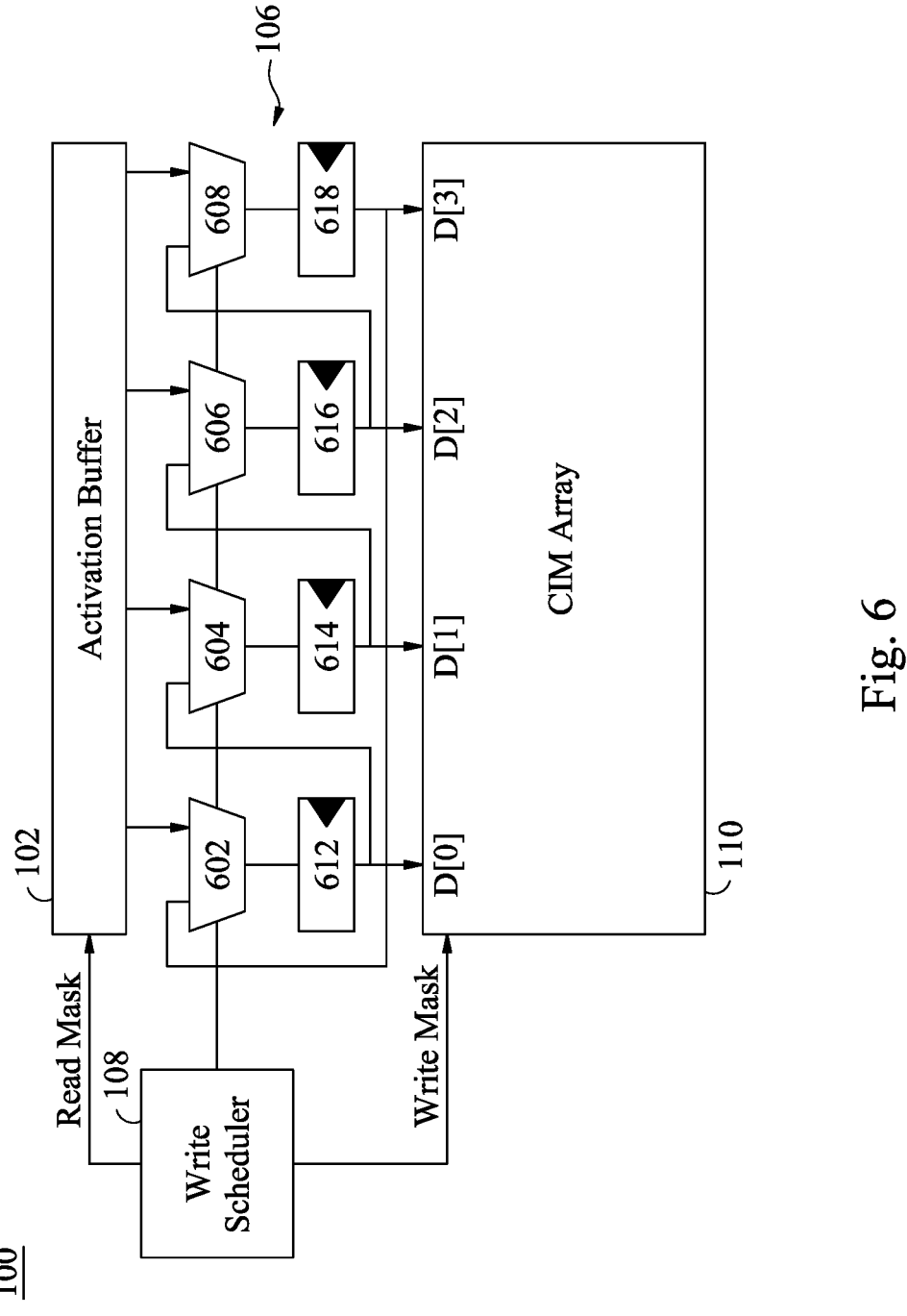
FIG. 6 is a block diagram illustrating an example of a memory circuit, in accordance with some embodiments.
Figure 7:
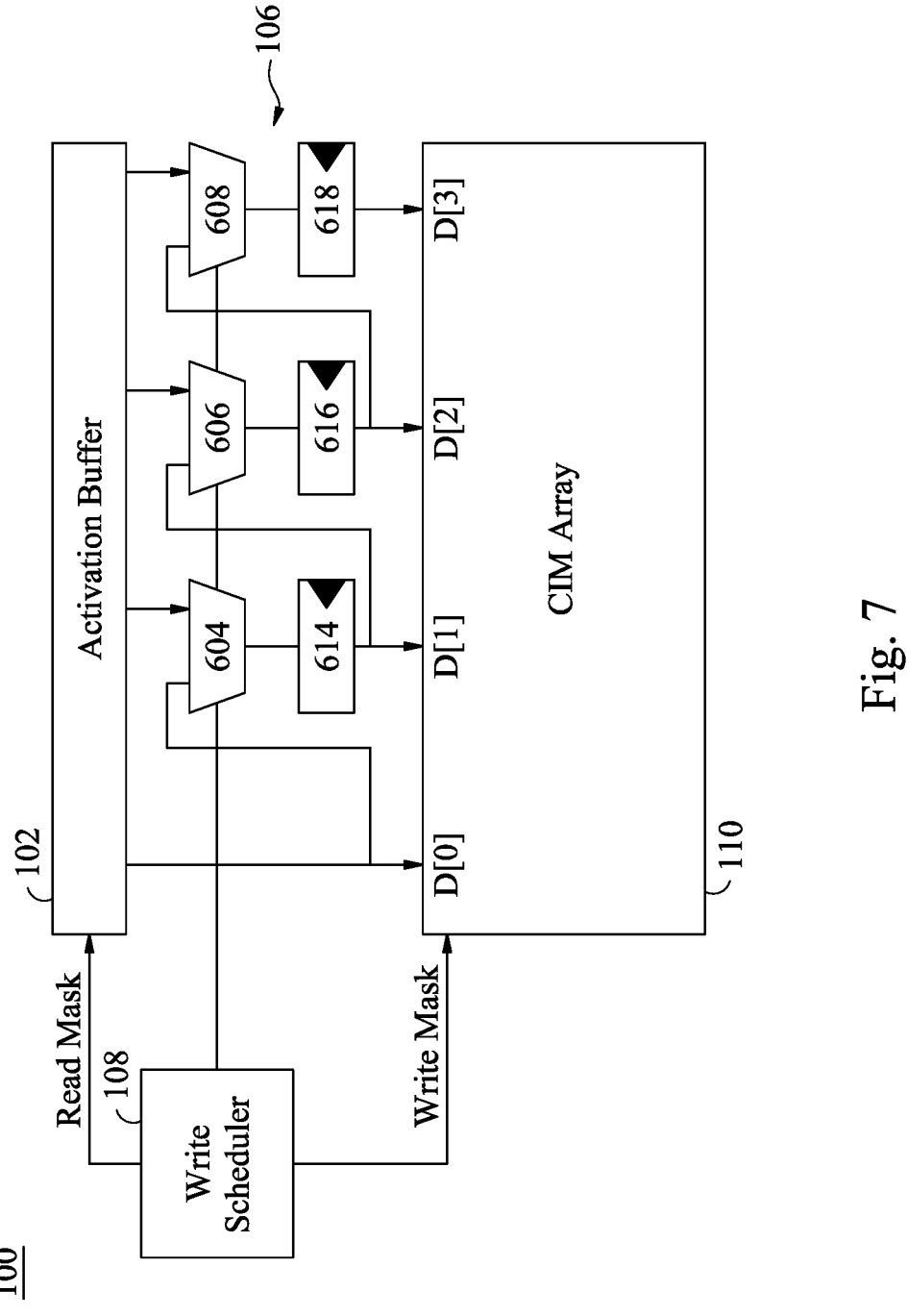
FIG. 7 is a block diagram illustrating an example of a memory circuit, in accordance with some embodiments.

FIG. 6 is a block diagram illustrating an example of a memory circuit 100, in accordance with some embodiments. FIG. 7 is a block diagram illustrating an example of a memory circuit 100, in accordance with some embodiments. The memory circuit may include a CIM array 110, an activation buffer 102, a fetch circuit 106, and a write scheduler 108. Although certain components are shown in FIGS. 6 and 7, embodiments are not limited thereto, and more or fewer components may be included in the memory circuit 100. In some embodiments, the memory circuit 100 can be used as a building block for an artificial intelligence (AI) accelerator. The memory circuit 100 of FIGS. 6 and 7 are substantially similar to the memory circuit 100 of FIG. 1. The specific operations of similar elements, which are already discussed in detail in above paragraphs, are omitted herein for the sake of brevity, unless there is a need to introduce the co-operation relationship with the elements shown in FIGS. 6 and 7. Assuming 4 data points to be written to an N×4 CIM array for the sake of simplicity in demonstration.

In some embodiments, the fetch circuit 106 may include a plurality of multiplexers 602, 604, 606, 608 (MUXs) and a plurality of registers 612, 614, 616, 618. The MUXs 602, 604, 606, 608 may select the data source between the activation buffer 102 and neighboring register. The registers may receive the output of the MUXs. The outputs of the registers may be provided to the CIM array. The fetch circuit 106 may output data signals to D[0], D[1], D[2], and D[3] through the registers 612, 614, 616, 618. In some embodiments, the fetch circuit 106 can be a shift-based fetch module. Considering the regular pattern of overlapping activations of the CNN, the shift-based fetch module utilizes shift registers to reuse the overlapping data, thereby avoiding repeated accesses to the activation buffer. In certain embodiments, the fetch circuit 106 may include less multiplexers (MUXs) 604, 606, 608 and less registers 614, 616, 618. The fetch circuit 106 may output data signals to D[1], D[2], and D[3] through the registers 614, 616, 618.

In some embodiments, the write scheduler 108 may include a hardware component that can control the coupled components (e.g., activation buffer 102, fetch circuit 106, and CIM array 110). The write scheduler 108 can be coupled to the fetch circuit 106 and configured to control the fetch circuit 106 to selectively limit fetching the first data elements from the activation buffer 102. For example, during a second subsequent cycle to write a second subset of the first data elements to a second subset of the PEs arranged along a second one of the rows, the write scheduler 108 may fetch part of the second subset of the first data elements from the activation buffer 102. In some embodiments, the write scheduler 108 can be configured to control signals that cater to diverse data mapping schemes within a memory architecture (e.g., memory circuit 100). The write scheduler may include a read mask and a write mask. The read mask can be used to filter out unnecessary SRAM access, e.g., only fetching new data from SRAM. The write scheduler 108 may coordinate the process by providing read/write mask signals and selecting signals for the MUXs. The write mask may select the target row for writing. Maximizing the reuse of shifted data can be achieved by appropriately configuring the sequence of row updates.

Figure 8:
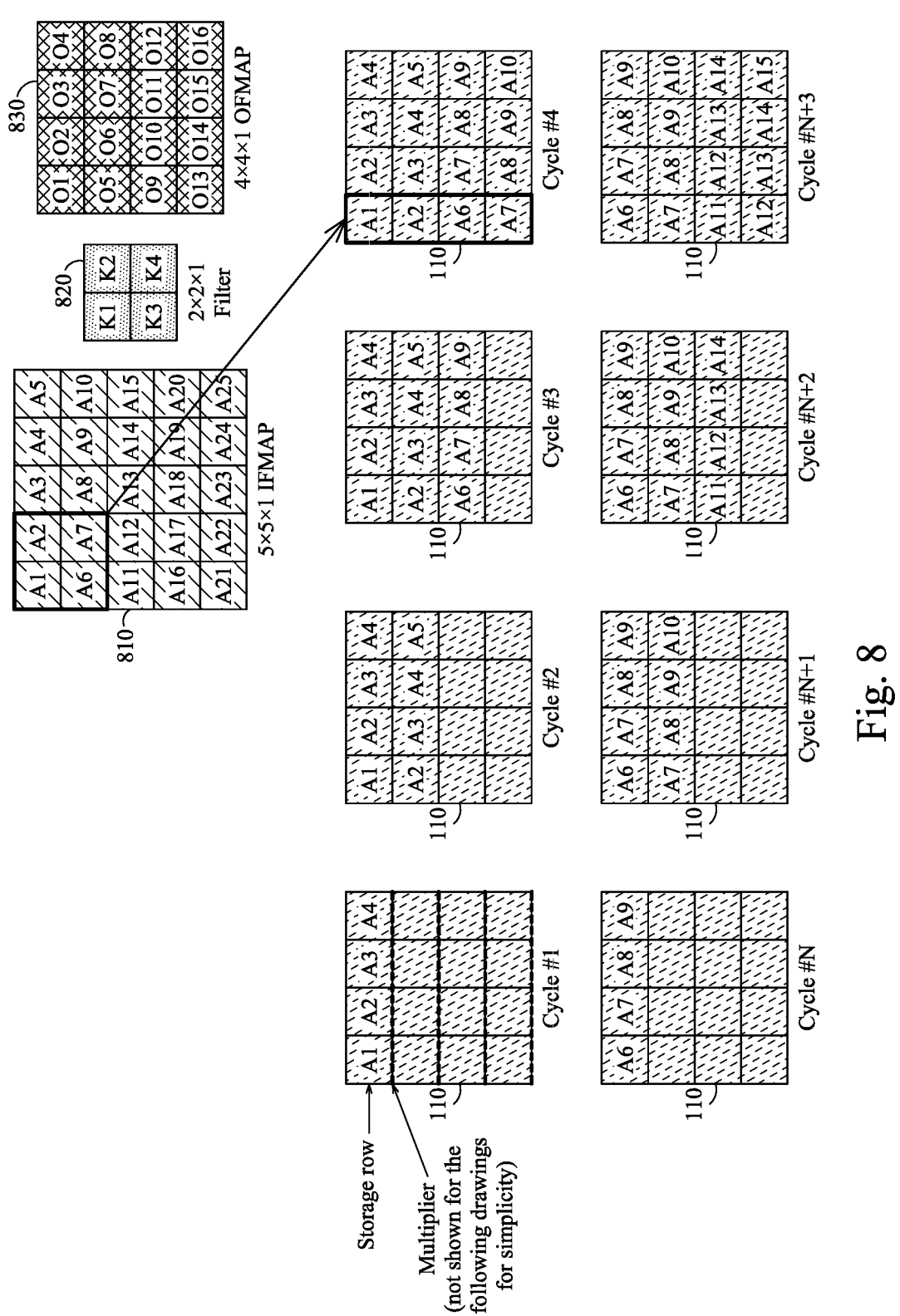
FIG. 8 illustrates an example data mapping in a single-storage-row compute-in-memory (CIM) array, in accordance with some embodiments.

FIG. 8 illustrates an example data mapping in a single-storage-row compute-in-memory (CIM) array without shift-based write, in accordance with some embodiments. In some embodiments, the CIM array 110 can be a 4×4 CIM array with a single-storage-row (e.g., one row per MAC cell). In the example data mapping in FIG. 8, a 5×5×1 input feature map 810 (e.g., IFMAP), a 2×2×1 filter 820, and a 4×4×1 output feature map 830 (e.g., OFMAP) are employed. The input activations (e.g., IFMAPs) are pre-filled and stored in each PE 110 of the CIM array 110 prior to the start of computation such that all of the PEs of a given filter are allocated along a column of PEs. The weights are then streamed in from the edge and each PE generates one partial sum every cycle. The generated partial sums can be then reduced across the rows, along each column in parallel to generate one output feature map (e.g., OFMAP) pixel per column.

In some embodiments, the fetch circuit 106 may fetch 4 data from activation buffer 102 (e.g., IFMAP) during each cycle. For example, during a first cycle (e.g., Cycle #1), the fetch circuit 106 may fetch A1, A2, A3, A4 from the IFMAP 810. The fetch circuit 106 may write A1, A2, A3, A4 to a first storage row in the CIM array 110. During a second cycle (e.g., Cycle #2), the fetch circuit 106 may fetch A2, A3, A4, A5 from the IFMAP 810. The fetch circuit 106 may write A2, A3, A4, A5 to a second storage row in the CIM array 110. During a third cycle (e.g., Cycle #3), the fetch circuit 106 may fetch A6, A7, A8, A9 from the IFMAP 810. The fetch circuit 106 may write A6, A7, A8, A9 to a third storage row in the CIM array 110. During a fourth cycle (e.g., Cycle #4), the fetch circuit 106 may fetch A7, A8, A9, A10 from the IFMAP 810. The fetch circuit 106 may write A7, A8, A9, A10 to a fourth storage row in the CIM array 110. In Cycle #4, each column of the CIM array may correspond to one CONV window (e.g., 2×2 CONV window) in the 5×5×1 input feature map 810 (e.g., IFMAP). The CIM array 110 may perform multiplication and accumulation (e.g., summation) operations based on inputs (e.g., A1, A2, A6, A7) and weights (e.g., K1, K2, K3, K4). The accumulator buffer 202 with in the CIM array 110 may calculate and generate the partial sum (PS) (e.g., A1×K1+A2×K2+A6×K3+A7× K4), which is then stored within output feature map (e.g., O1 in the OFMAP 830).

After the computation is done with the previous group of activations, fetch new data from the activation buffer 102 to overwrite the previous CIM array 110. For example, during a Nth cycle (e.g., Cycle #N), the fetch circuit 106 may fetch A6, A7, A8, A9 from the IFMAP 810. The fetch circuit 106 may write A6, A7, A8, A9 to the first storage row in the CIM array 110. During a N+1th cycle (e.g., Cycle #N+1), the fetch circuit 106 may fetch A7, A8, A9, A10 from the IFMAP 810. The fetch circuit 106 may write A7, A8, A9, A10 to the second storage row in the CIM array 110. During a N+2th cycle (e.g., Cycle #N+2), the fetch circuit 106 may fetch A11, A12, A13, A14 from the IFMAP 810. The fetch circuit 106 may write A11, A12, A13, A14 to the third storage row in the CIM array 110. During a N+3th cycle (e.g., Cycle #N+3), the fetch circuit 106 may fetch A12, A13, A14, A15 from the IFMAP 810. The fetch circuit 106 may write A12, A13, A14, A15 to the fourth storage row in the CIM array 110. In Cycle #N+3, each column of the CIM array may correspond to one CONV window (e.g., 2×2 CONV window) in the 5×5×1 input feature map 810 (e.g., IFMAP). The CIM array 110 may perform multiplication and accumulation (e.g., summation) operations based on inputs (e.g., A6, A7, A11, A12) and weights (e.g., K1, K2, K3, K4). The accumulator buffer 202 with in the CIM array 110 may calculate and generate the partial sum (PS) (e.g., A6×K1+A7×K2+A11×K3+A12×K4), which is then stored within output feature map (e.g., O5 in the OFMAP 830). In total, there are 32 data accesses from the activation buffer 102.

Figure 9:
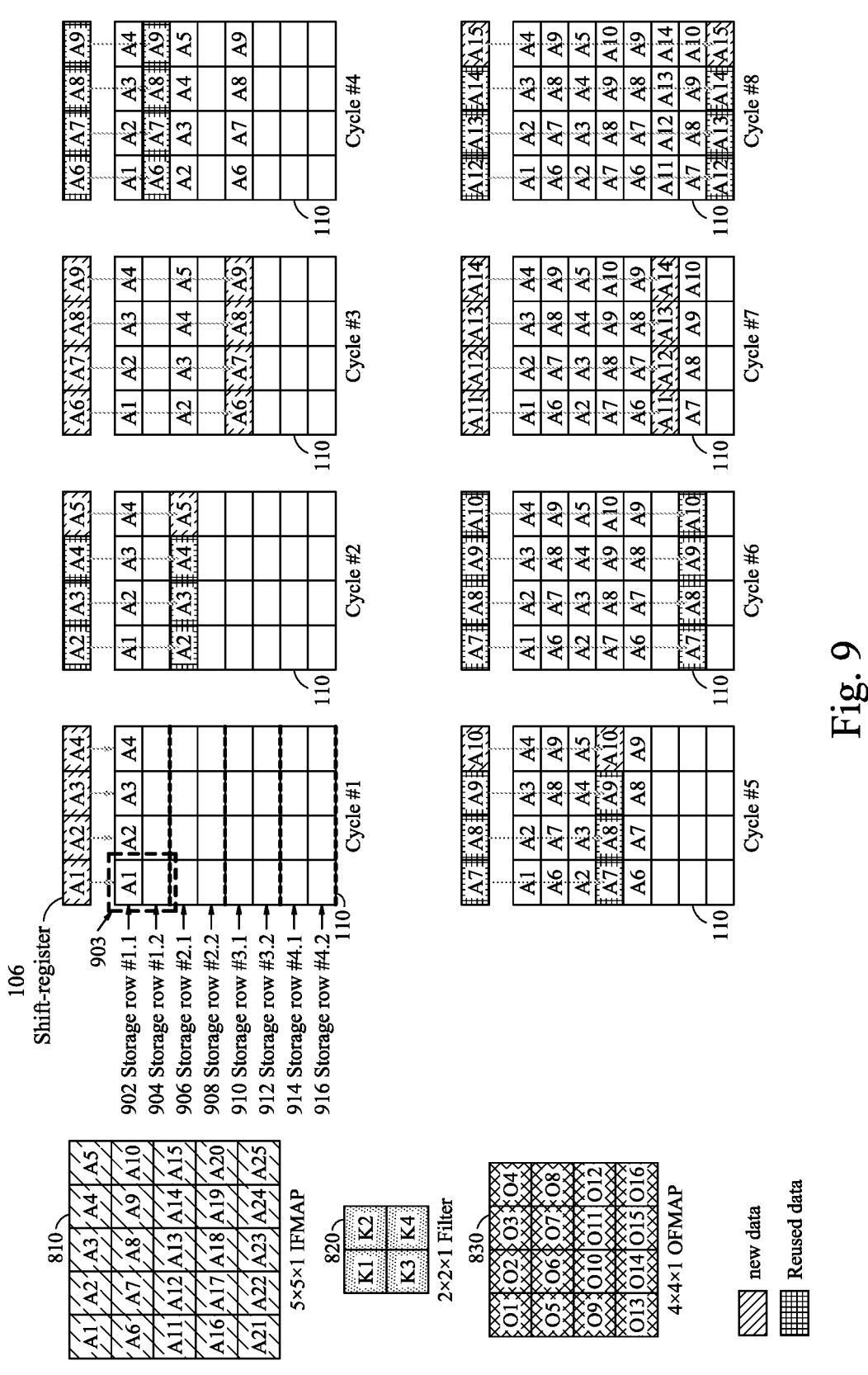
FIG. 9 illustrates an example data mapping in a multi-storage-row compute-in-memory (CIM) array, in accordance with some embodiments.

FIG. 9 illustrates an example data mapping in a multi-storage-row compute-in-memory (CIM) array with shift-based write, in accordance with some embodiments. In some embodiments, the CIM array 110 can be a 4×4 CIM array with a two-storage-row (e.g., two rows per MAC cell). In the example data mapping in FIG. 9, a 5×5×1 input feature map 810 (e.g., IFMAP), a 2×2×1 filter 820 (stride size=1), and a 4×4×1 output feature map 830 (e.g., OFMAP) are employed. The input activations (e.g., IFMAPs) are pre-filled and stored in each PE 110 of the CIM array 110 prior to the start of computation such that all of the PEs of a given filter are allocated along a column of PEs. The weights are then streamed in from the edge and each PE generates one partial sum every cycle. The generated partial sums can be then reduced across the rows, along each column in parallel to generate one output feature map (e.g., OFMAP) pixel per column.

In some embodiments, the fetch circuit 106 may fetch 4 data from activation buffer 102 (e.g., IFMAP) during each cycle. Given an array configuration and certain workload (e.g., a filter size, a stride size, an activation buffer size, a weight buffer size, a kernel size, or a size of the plurality of PEs), the data fetch pattern can be determined upfront. Each column of the CIM array 110 include two storage rows (e.g., 902 and 904). For example, during a first cycle (e.g., Cycle #1), the fetch circuit 106 may fetch A1, A2, A3, A4 from the IFMAP 810. The fetch circuit 106 may write A1, A2, A3, A4 to a first storage row 902 (e.g., storage row #1.1 (MAC row number, storage row #)) in the CIM array 110. The CIM array 110 may include a multiplier 903 (not shown for the following cycles for simplicity).

In some embodiments, prior to fetching any new data from the first buffer 102, the controller 108 (e.g., write scheduler) can determine whether to reuse old data in the fetch circuit 106 (e.g., shift-register) based on identifying that the old data will be overlapped by a filter in one or more following cycles in a CNN. For example, during a second cycle (e.g., Cycle #2), the fetch circuit 106 may reuse A2, A3, A4, and fetch A5 from the IFMAP 810. The fetch circuit 106 may write A2, A3, A4, A5 to a second storage row 904 (e.g., storage row #1.2 (MAC row number, storage row #)) in the CIM array 110. During a third cycle (e.g., Cycle #3), the fetch circuit 106 may fetch A6, A7, A8, A9 from the IFMAP 810. The fetch circuit 106 may write A6, A7, A8, A9 to a first storage row 906 (e.g., storage row #2.1 (MAC row number, storage row #)) in the CIM array 110.

During a fourth cycle (e.g., Cycle #4), the fetch circuit 106 may reuse A6, A7, A8, A9. The fetch circuit 106 may write A6, A7, A8, A9 to a second storage row 904 (e.g., storage row #1.2 (MAC row number, storage row #)) in the CIM array 110. Such reused data can be configured to generate a new output (or PS) in the next row (e.g., O5 in OFMAP 830). During a fifth cycle (e.g., Cycle #5), the fetch circuit 106 may reuse A7, A8, A9, and fetch A10 from the IFMAP 810. The fetch circuit 106 may write A7, A8, A9, A10 to a second storage row 908 (e.g., storage row #2.2 (MAC row number, storage row #)) in the CIM array 110.

During a sixth cycle (e.g., Cycle #6), the fetch circuit 106 may reuse A7, A8, A9, A10. The fetch circuit 106 may write A7, A8, A9, A10 to a first storage row 914 (e.g., storage row #4.1 (MAC row number, storage row #)) in the CIM array 110. Such reused data can be configured to generate a new output (or PS) in the next row (e.g., O5 in OFMAP 830). During a seventh cycle (e.g., Cycle #7), the fetch circuit 106 may fetch A11, A12, A13, A14 from the IFMAP 810. The fetch circuit 106 may write A11, A12, A13, A14 to a second storage row 912 (e.g., storage row #3.2 (MAC row number, storage row #)) in the CIM array 110. During an eighth cycle (e.g., Cycle #8), the fetch circuit 106 may reuse A12, A13, A14, and fetch A15 from the IFMAP 810. The fetch circuit 106 may write A12, A13, A14, A15 to a second storage row 916 (e.g., storage row #4.2 (MAC row number, storage row #)) in the CIM array 110. In FIG. 9, the same weights can be multiplied with two groups of activations separately (through row-switching) to generate two partial sums from each column of the CIM array 110. For example, the CIM array 110 may perform multiplication and accumulation (e.g., summation) operations based on inputs (e.g., A1, A2, A6, A7) in the first storage row and weights (e.g., K1, K2, K3, K4). The accumulator buffer 202 with in the CIM array 110 may calculate and generate the partial sum (PS) (e.g., A1×K1+A2×K2+A6×K3+A7×K4), which is then stored within output feature map (e.g., O1 in the OFMAP 830). The CIM array 110 may perform multiplication and accumulation (e.g., summation) operations based on inputs (e.g., A6, A7, A11, A12) in the second storage row and weights (e.g., K1, K2, K3, K4). The accumulator buffer 202 with in the CIM array 110 may calculate and generate the partial sum (PS) (e.g., A6×K1+A7×K2+A11×K3+A12×K4), which is then stored within output feature map (e.g., O5 in the OFMAP 830). In total, there are 15 accesses to the activation buffer 102, representing a reduction of more than 2 times from the previous count of 32, along with 9 accesses to the shift register 106.

Figure 10:
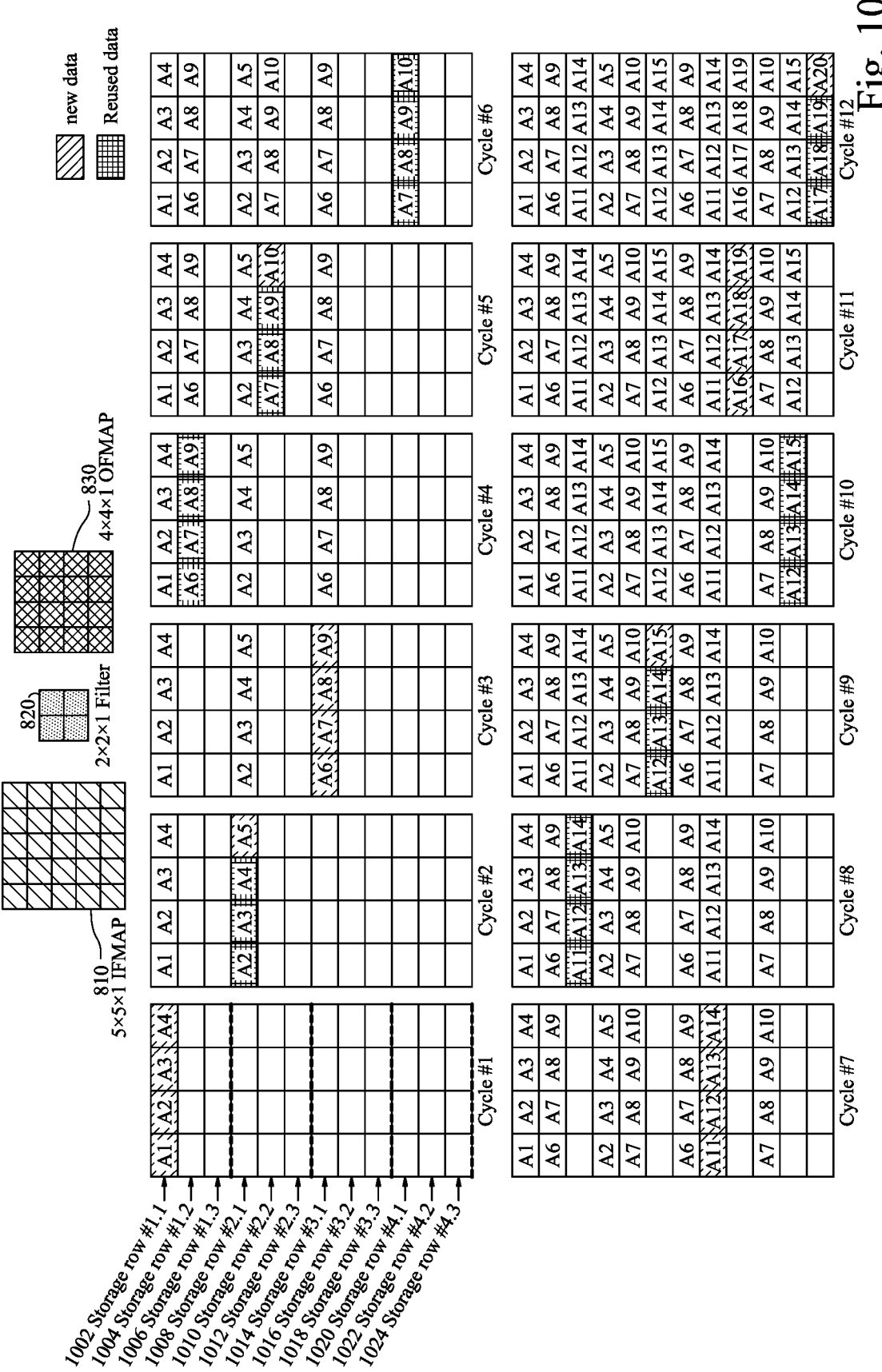
FIG. 10 illustrates an example data mapping in a multi-storage-row compute-in-memory (CIM) array, in accordance with some embodiments.

FIG. 10 illustrates an example data mapping in a multi-storage-row compute-in-memory (CIM) array with shift-based write, in accordance with some embodiments. In some embodiments, the CIM array 110 can be a 4×4 CIM array with a three-storage-row (e.g., three rows per MAC cell). In the example data mapping in FIG. 10, a 5×5×1 input feature map 810 (e.g., IFMAP), a 2×2×1 filter 820 (stride size=1), and a 4×4×1 output feature map 830 (e.g., OFMAP) are employed. The input activations (e.g., IFMAPs) are pre-filled and stored in each PE 110 of the CIM array 110 prior to the start of computation such that all of the PEs of a given filter are allocated along a column of PEs. The weights are then streamed in from the edge and each PE generates one partial sum every cycle. The generated partial sums can be then reduced across the rows, along each column in parallel to generate one output feature map (e.g., OFMAP) pixel per column.

In some embodiments, the fetch circuit 106 may fetch 4 data from activation buffer 102 (e.g., IFMAP) during each cycle. Given an array configuration and certain workload (e.g., a filter size, a stride size, an activation buffer size, a weight buffer size, a kernel size, or a size of the plurality of PEs), the data fetch pattern can be determined upfront. Each column of the CIM array 110 include three storage rows (e.g., 1002, 1004, and 1006). For example, during a first cycle (e.g., Cycle #1), the fetch circuit 106 may fetch A1, A2, A3, A4 from the IFMAP 810. The fetch circuit 106 may write A1, A2, A3, A4 to a first storage row 1002 (e.g., storage row #1.1 (MAC row number, storage row #)) in the CIM array 110. The CIM array 110 may include a multiplier (not shown for simplicity).

In some embodiments, prior to fetching any new data from the first buffer 102, the controller 108 (e.g., write scheduler) can determine whether to reuse old data in the fetch circuit 106 (e.g., shift-register) based on identifying that the old data will be overlapped by a filter in one or more following cycles in a CNN. For example, during a second cycle (e.g., Cycle #2), the fetch circuit 106 may reuse A2, A3, A4, and fetch A5 from the IFMAP 810. The fetch circuit 106 may write A2, A3, A4, A5 to a first storage row 1008 (e.g., storage row #2.1 (MAC row number, storage row #)) in the CIM array 110. During a third cycle (e.g., Cycle #3), the fetch circuit 106 may fetch A6, A7, A8, A9 from the IFMAP 810. The fetch circuit 106 may write A6, A7, A8, A9 to a first storage row 1014 (e.g., storage row #3.1 (MAC row number, storage row #)) in the CIM array 110.

During a fourth cycle (e.g., Cycle #4), the fetch circuit 106 may reuse A6, A7, A8, A9. The fetch circuit 106 may write A6, A7, A8, A9 to a second storage row 1004 (e.g., storage row #1.2 (MAC row number, storage row #)) in the CIM array 110. Such reused data can be configured to generate a new output (or PS) in the next row (e.g., O5 in OFMAP 830). During a fifth cycle (e.g., Cycle #5), the fetch circuit 106 may reuse A7, A8, A9, and fetch A10 from the IFMAP 810. The fetch circuit 106 may write A7, A8, A9, A10 to a second storage row 1010 (e.g., storage row #2.2 (MAC row number, storage row #)) in the CIM array 110.

During a sixth cycle (e.g., Cycle #6), the fetch circuit 106 may reuse A7, A8, A9, A10. The fetch circuit 106 may write A7, A8, A9, A10 to a first storage row 1020 (e.g., storage row #4.1 (MAC row number, storage row #)) in the CIM array 110. Such reused data can be configured to generate a new output (or PS) in the next row (e.g., O5 in OFMAP 830). During a seventh cycle (e.g., Cycle #7), the fetch circuit 106 may fetch A11, A12, A13, A14 from the IFMAP 810. The fetch circuit 106 may write A11, A12, A13, A14 to a second storage row 1016 (e.g., storage row #3.2 (MAC row number, storage row #)) in the CIM array 110. During an eighth cycle (e.g., Cycle #8), the fetch circuit 106 may reuse A12, A13, A14, and fetch A15 from the IFMAP 810. The fetch circuit 106 may write A12, A13, A14, A15 to a third storage row 1006 (e.g., storage row #1.3 (MAC row number, storage row #)) in the CIM array 110.

During a ninth cycle (e.g., Cycle #9), the fetch circuit 106 may reuse A12, A13, A14, and fetch A15 from the IFMAP 810. The fetch circuit 106 may write A12, A13, A14, A15 to a third storage row 1012 (e.g., storage row #2.3 (MAC row number, storage row #)) in the CIM array 110. During a tenth cycle (e.g., Cycle #10), the fetch circuit 106 may reuse A12, A13, A14, A15. The fetch circuit 106 may write A12, A13, A14, A15 to a second storage row 1022 (e.g., storage row #4.2 (MAC row number, storage row #)) in the CIM array 110. During an eleventh cycle (e.g., Cycle #11), the fetch circuit 106 may fetch A16, A17, A18, A19 from the IFMAP 810. The fetch circuit 106 may write A16, A17, A18, A19 to a third storage row 1018 (e.g., storage row #3.3 (MAC row number, storage row #)) in the CIM array 110. During a twelfth cycle (e.g., Cycle #12), the fetch circuit 106 may reuse A17, A18, A19, and fetch A20 from the IFMAP 810. The fetch circuit 106 may write A17, A18, A19, A20 to a third storage row 1024 (e.g., storage row #4.3 (MAC row number, storage row #)) in the CIM array 110. In FIG. 10, the same weights can be multiplied with three groups of activations separately (through row-switching) to generate three partial sums from each column of the CIM array 110. For example, the CIM array 110 may perform multiplication and accumulation (e.g., summation) operations based on inputs (e.g., A1, A2, A6, A7) in the first storage row and weights (e.g., K1, K2, K3, K4). The accumulator buffer 202 with in the CIM array 110 may calculate and generate the partial sum (PS) (e.g., A1×K1+A2×K2+A6×K3+A7×K4), which is then stored within output feature map (e.g., O1 in the OFMAP 830). The CIM array 110 may perform multiplication and accumulation (e.g., summation) operations based on inputs (e.g., A6, A7, A11, A12) in the second storage row and weights (e.g., K1, K2, K3, K4). The accumulator buffer 202 with in the CIM array 110 may calculate and generate the partial sum (PS) (e.g., A6×K1+A7×K2+A11×K3+A12×K4), which is then stored within output feature map (e.g., O5 in the OFMAP 830). The CIM array 110 may perform multiplication and accumulation (e.g., summation) operations based on inputs (e.g., A11, A12, A16, A17) in the third storage row and weights (e.g., K1, K2, K3, K4). The accumulator buffer 202 with in the CIM array 110 may calculate and generate the partial sum (PS) (e.g., A11×K1+A12×K2+A16×K3+A17×K4), which is then stored within output feature map (e.g., O9 in the OFMAP 830). Having one more storage row (row #3) allows for the reuse of data fetched for row #2 to write row #3, resulting in further savings. By intelligently adjusting the allocation of data to storage rows based on the unique requirements of each layer, this method ensures a more efficient use of memory resources.

FIG. 11 illustrates an example data mapping in a multi-storage-row compute-in-memory (CIM) array, in accordance with some embodiments. In some embodiments, the CIM array 110 can be a 9×4 CIM array with a two-storage-row (e.g., two rows per MAC cell). In the example data mapping in FIG. 11, a 9×9×1 input feature map 1110 (e.g., IFMAP), a 3×3×1 filter 1120 (stride size=2), and a 4×4×1 output feature map 830 (e.g., OFMAP) are employed. The input activations (e.g., IFMAPs) are pre-filled and stored in each PE 110 of the CIM array 110 prior to the start of computation such that all of the PEs of a given filter are allocated along a column of PEs. The weights are then streamed in from the edge and each PE generates one partial sum every cycle. The generated partial sums can be then reduced across the rows, along each column in parallel to generate one output feature map (e.g., OFMAP) pixel per column.

In some embodiments, the fetch circuit 106 may fetch 4 data from activation buffer 102 (e.g., IFMAP) during each cycle. Given an array configuration and certain workload (e.g., a filter size, a stride size, an activation buffer size, a weight buffer size, a kernel size, or a size of the plurality of PEs), the data fetch pattern can be determined upfront. Each column of the CIM array 110 include two storage rows. In some embodiments, the shift-register hardware remains unchanged, as it continues to necessitate shifting by one step. In FIG. 11, the write protocol varies depending on the case, such as the example depicted in FIG. 8, to accommodate different scenarios.

FIG. 12 illustrates a flowchart of an example method of operating a compute-in-memory (CIM) circuit 100, in accordance with some embodiments. It is noted that the method 1200 is merely an example, and is not intended to limit the present disclosure. Accordingly, it is understood that any additional operations may be provided during, before, and after the method 1200 of FIG. 12, and that some other operations may only be briefly described herein. The method

1200 may be utilized to operate the memory circuit 110, and thus, operations of the method 1200 will be discussed in conjunction with the components discussed in FIGS. 1-11.

In brief overview, the method 1200 starts with operation 1202 of receiving a plurality of first data elements. In some embodiments, the fetch circuit may receive a plurality of first data elements from the first buffer 102. Next, the method 1200 proceeds to operation 1204 of fetching a first subset of the first data elements and temporarily store the first subset of the first data elements, during a first cycle to write the first subset of the first data elements to a first subset of a plurality of processing elements (PEs). For example, during a first cycle to write a first subset of the first data elements to a first subset of the PEs arranged along a first one of the rows, the fetch circuit 106 may fetch a first subset of the first data elements from the first buffer 102 and temporarily store the first subset of the first data elements. Considering the regular pattern of overlapping activations of the CNN, the fetch circuit 106 may utilize shift registers to reuse the overlapping data.

Next, the method 1200 proceeds to operation 1206 of determining whether to reuse at least one of the first subset of the first data elements based on a configuration of an artificial intelligence (AI) neural network associated with the plurality of first data elements. In some embodiments, the configuration of the AI neural network includes at least one of: a filter size, a stride size, an activation buffer size, a weight buffer size, a kernel size, or a size of the plurality of PEs. In some embodiments, prior to fetching any new data from the first buffer 102, the controller 108 (e.g., write scheduler) can determine whether to reuse old data in the fetch circuit 106 (e.g., shift-register) based on identifying that the old data can be overlapped by a filter in one or more following cycles in a CNN.

Next, the method 1200 proceeds to operation 1208 of selectively limit fetching a second subset of the first data elements, during a second subsequent cycle to write the second subset of the first data elements to a second subset of the PEs, based on determination of whether to reuse the at least one of the first subset. For example, during a certain cycle (e.g., Cycle #2), the fetch circuit 106 may reuse part of the first subset (e.g., A2, A3, A4), and fetch new data (e.g., A5) from the first buffer 102.

The present disclosure outlines an approach to enhancing the energy efficiency and processing throughput of convolutional neural networks (CNNs), pivotal in artificial intelligent (AI)-driven tasks such as computer vision applications. By dynamically adapting the data mapping and operational flow within the multi-storage-row Compute-in-Memory (CIM) macro to suit the unique demands of various neural network layers, the present disclosure provides significant improvements in computational performance.

As used herein, the terms "about" and "approximately" generally mean plus or minus 10% of the stated value. For example, about 0.5 would include 0.45 and 0.55, about 10 would include 9 to 11, about 1000 would include 900 to 1100.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory circuit, comprising:
   an array comprising a plurality of processing elements (PEs) arranged over a plurality of columns and a plurality of rows, wherein each of the PEs is configured to perform a multiplication and accumulation (MAC) operation on a corresponding one of a plurality of first data elements and a corresponding one of a plurality of second data elements;
   a first buffer configured to store the first data elements and output the first data elements to the array;
   a second buffer configured to store the second data elements and output the second data elements to the array;
   a fetch circuit coupled between the first buffer and the array, wherein the fetch circuit is configured to fetch a first subset of the first data elements from the first buffer and temporarily store the first subset of the first data elements, during a first cycle to write the first subset of the first data elements to a first subset of the PEs arranged along a first one of the rows; and
   a controller coupled to the fetch circuit and configured to control the fetch circuit to selectively limit fetching a second subset of the first data elements from the first buffer, during a second subsequent cycle to write the second subset of the first data elements to a second subset of the PEs arranged along a second one of the rows.

2. The memory circuit of claim 1, wherein the fetch circuit includes a plurality of multiplexers and a plurality of registers.

3. The memory circuit of claim 2, wherein each of the plurality of multiplexers, controlled by the controller, includes a first input, a second input, and an output coupled to a corresponding one of the registers which is further coupled to a corresponding one of the columns.

4. The memory circuit of claim 3, wherein the multiplexers and the corresponding registers are connected to one another in a shift-based manner, such that the first input of a first one of the multiplexers is coupled to the first buffer, with the second input of the first multiplexer coupled to an output of a second one of the registers, the first input of a second one of the multiplexers is coupled to the first buffer, with the second input of the second multiplexer coupled to an output of a third one of the registers, and the first input of a third one of the multiplexers is coupled to the first buffer, with the second input of the third multiplexer coupled to an output of a fourth one of the registers.

5. The memory circuit of claim 2, wherein the first subset of the first data elements are temporarily stored in some of the registers during the first cycle.

6. The memory circuit of claim 5, wherein one or more of the second subset of the first data elements remain stored in some of the registers during the second cycle.

7. The memory circuit of claim 1, wherein the first subset of the first data elements and the second subset of the first data elements are different from each other by one of the first data elements.

8. The memory circuit of claim 1, wherein the first subset of the first data elements and the second subset of the first data elements are completely different from each other.

9. The memory circuit of claim 1, wherein the first subset of the first data elements and the second subset of the first data elements are exactly identical to each other.

10. The memory circuit of claim 1, wherein at least one of the second data elements are configured to be multiplied with a third subset of the first data elements and with a fourth subset of the first data elements.

11. The memory circuit of claim 10, wherein the third subset of the first data elements and the fourth subset of the first data elements are written into a third one of the rows and a fourth one of the rows, respectively, and wherein the third row and the fourth row are disposed immediately next to each other.

12. A memory circuit, comprising:

an array comprising a plurality of processing elements (PEs) arranged over a plurality of columns and a plurality of rows, wherein each of the PEs is configured to perform a multiplication and accumulation (MAC) operation on a corresponding one of a plurality of first data elements and a corresponding one of a plurality of second data elements;

a fetch circuit coupled to the array and configured to fetch a first subset of the first data elements from a corresponding buffer, during a first cycle for the first subset of the first data elements to be written to a first subset of the PEs arranged along a first one of the rows; and a controller coupled to the fetch circuit and configured to cause the fetch circuit to limit fetching a second subset of the first data elements from the buffer, during a second subsequent cycle for the second subset of the first data elements to be written to a second subset of the PEs arranged along a second one of the rows.

13. The memory circuit of claim 12, wherein the buffer is an activation buffer configured to store the first data elements and output the first data elements to the array, or a weight buffer configured to store the second data elements and output the second data elements to the array.

14. The memory circuit of claim 12, wherein the fetch circuit includes a plurality of multiplexers and a plurality of registers.

15. The memory circuit of claim 14, wherein each of the plurality of multiplexers, controlled by the controller, includes a first input, a second input, and an output coupled to a corresponding one of the registers which is further coupled to a corresponding one of the columns.

16. The memory circuit of claim 15, wherein the multiplexers and the corresponding registers are connected to one another in a shift-based manner, such that the first input of a first one of the multiplexers is coupled to the buffer, with the second input of the first multiplexer coupled to an output of a second one of the registers, the first input of a second one of the multiplexers is coupled to the buffer, with the second input of the second multiplexer coupled to an output of a third one of the registers, and the first input of a third one of the multiplexers is coupled to the buffer, with the second input of the third multiplexer coupled to an output of a fourth one of the registers.

17. The memory circuit of claim 14, wherein the first subset of the first data elements are temporarily stored in some of the registers during the first cycle.

18. The memory circuit of claim 17, wherein one or more of the second subset of the first data elements remain stored in some of the registers during the second cycle.

19. A method for operating a compute-in-memory (CIM) circuit, comprising:

receiving, through a buffer, a plurality of first data elements;

fetching, through the buffer, a first subset of the first data elements and temporarily store the first subset of the first data elements, during a first cycle to write the first subset of the first data elements to a first subset of a plurality of processing elements (PEs);

determining, through the buffer, whether to reuse at least one of the first subset of the first data elements based on a configuration of an artificial intelligence (AI) neural network associated with the plurality of first data elements; and selectively limit fetching, through the buffer, a second subset of the first data elements, during a second subsequent cycle to write the second subset of the first data elements to a second subset of the PEs, based on determination of whether to reuse the at least one of the first subset.

20. The method of claim 19, wherein the configuration of the AI neural network includes at least one of: a filter size, a stride size, an activation buffer size, a weight buffer size, a kernel size, or a size of the plurality of PEs.

* * * * *